(12) United States Patent
Soejima

(10) Patent No.: US 11,525,679 B2
(45) Date of Patent: *Dec. 13, 2022

(54) ANGULAR VELOCITY SENSOR AND SENSOR ELEMENT

(71) Applicant: KYOCERA Corporation, Kyoto (JP)

(72) Inventor: Munetaka Soejima, Soraku-gun (JP)

(73) Assignee: KYOCERA CORPORATION, Kyoto (JP)

( * ) Notice: Subject to any disclaimer, the term of this patent is extended or adjusted under 35 U.S.C. 154(b) by 362 days.

This patent is subject to a terminal disclaimer.

(21) Appl. No.: 16/641,924

(22) PCT Filed: Aug. 24, 2018

(86) PCT No.: PCT/JP2018/031349
§ 371 (c)(1),
(2) Date: Feb. 25, 2020

(87) PCT Pub. No.: WO2019/044696
PCT Pub. Date: Mar. 7, 2019

(65) Prior Publication Data
US 2020/0217663 A1 Jul. 9, 2020

(30) Foreign Application Priority Data

Aug. 29, 2017 (JP) .............................. JP2017-164318

(51) Int. Cl.
*G01L 9/00* (2006.01)
*H01L 21/00* (2006.01)
(Continued)

(52) U.S. Cl.
CPC ........ *G01C 19/5607* (2013.01); *H01L 41/042* (2013.01); *H01L 41/047* (2013.01); *H01L 41/0825* (2013.01)

(58) Field of Classification Search
CPC ............ H01L 41/0825; G01C 19/5642; G01C 19/574
(Continued)

(56) References Cited

U.S. PATENT DOCUMENTS

| 6,439,051 B2 * | 8/2002 | Kikuchi | ............. | G01C 19/5607 |
| | | | | 73/504.12 |
| 11,112,247 B2 * | 9/2021 | Soejima | ................ | H01L 41/047 |

(Continued)

FOREIGN PATENT DOCUMENTS

JP 2005-037235 A 2/2005

*Primary Examiner* — Calvin Lee
(74) *Attorney, Agent, or Firm* — Volpe Koenig

(57) ABSTRACT

In an angular velocity sensor, a pair of support parts are separated from each other in an x-axis direction in an orthogonal coordinate system xyz. A main part extends along the x-axis. A pair of extension parts connect two ends of the main part and inner sides of the support parts. The driving arms extend from the main part alongside each other in a y-axis direction separated from each other in the x-axis direction. The detecting arm extends from the main part in the y-axis direction at a position which is between the pair of driving arms. The driving circuit supplies voltages so that the pair of driving arms vibrate so as to bend to inverse sides from each other in the x-axis direction. The detecting circuit detects the signal generated due to bending deformation of the detecting arm in the z-axis direction.

8 Claims, 11 Drawing Sheets

(51) Int. Cl.
*G01C 19/5607* (2012.01)
*H01L 41/04* (2006.01)
*H01L 41/047* (2006.01)
*H01L 41/08* (2006.01)

(58) Field of Classification Search
USPC .............................. 438/53, 57; 257/254, 419
See application file for complete search history.

(56) References Cited

U.S. PATENT DOCUMENTS

| 2005/0011267 | A1 | 1/2005 | Kikuchi | |
| 2017/0052027 | A1* | 2/2017 | Jomori | B81B 3/0021 |
| 2019/0376789 | A1* | 12/2019 | Soejima | B81B 3/00 |

* cited by examiner

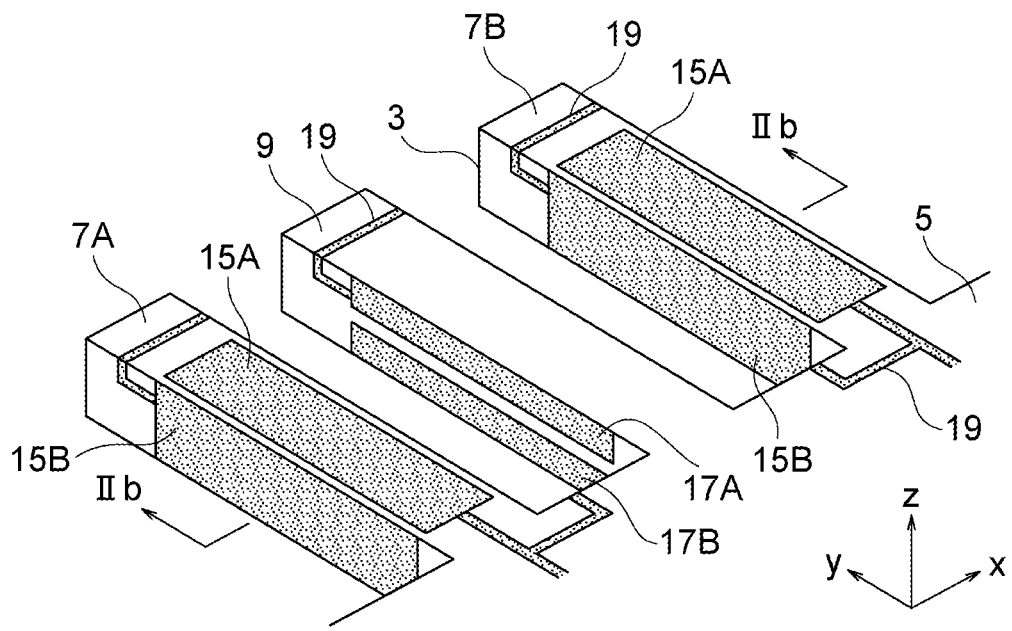
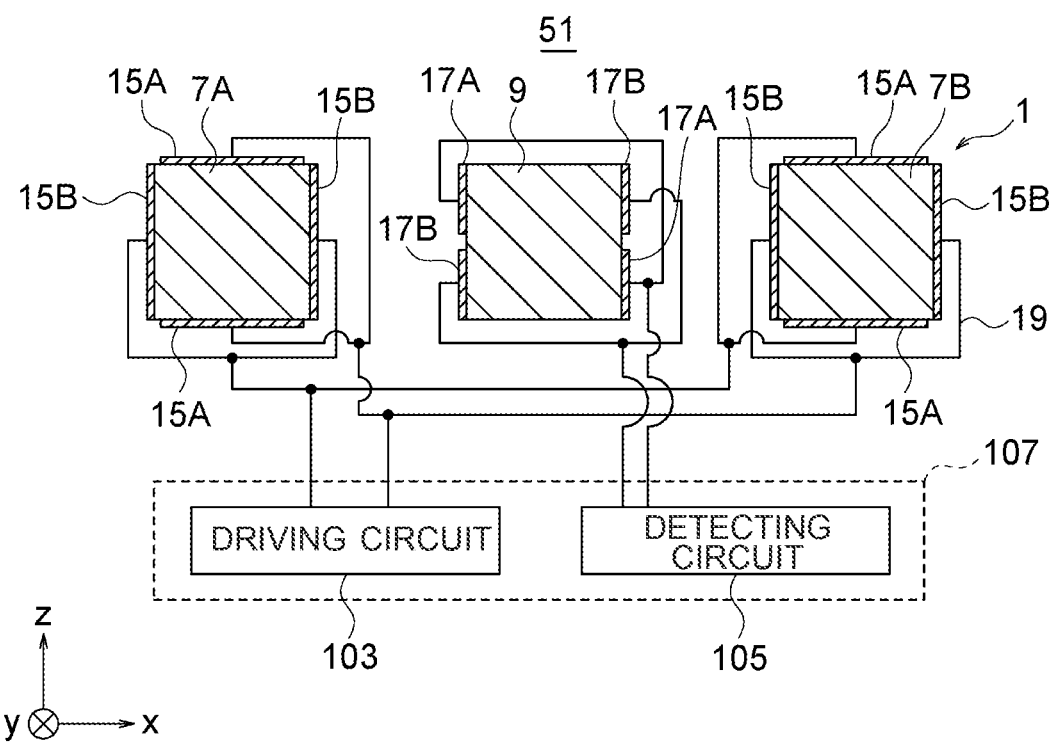

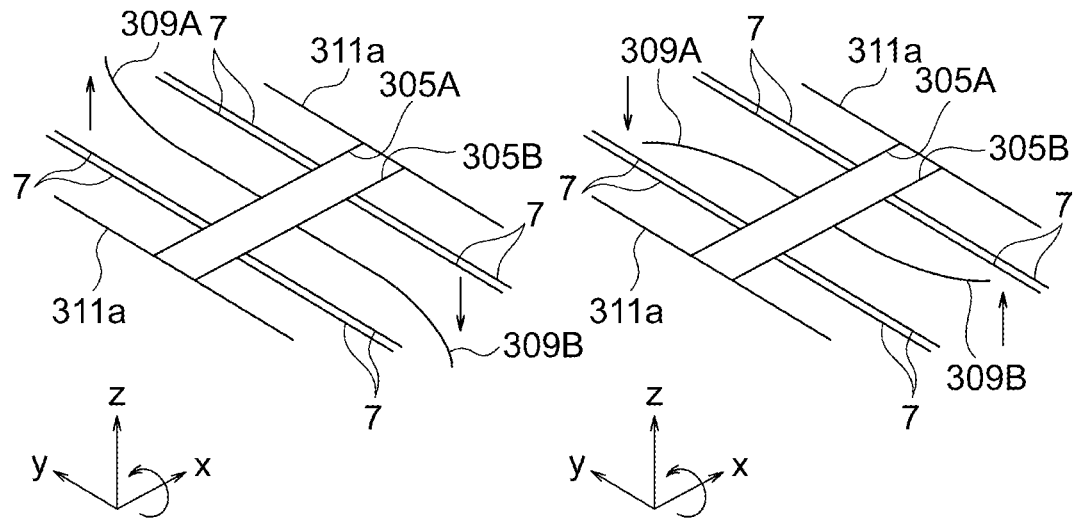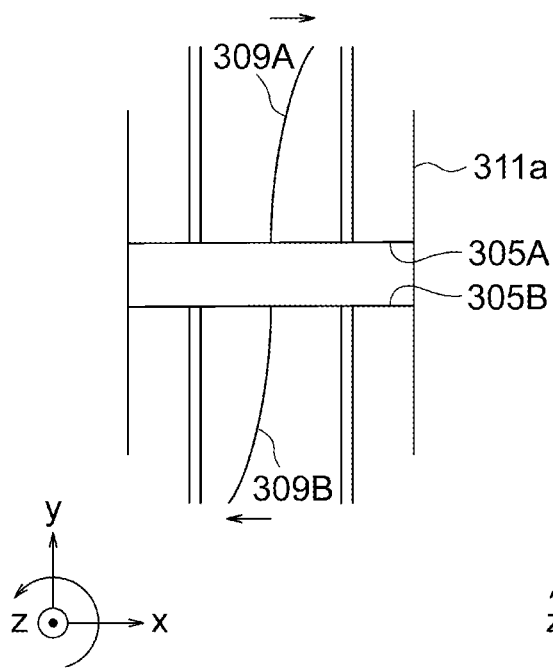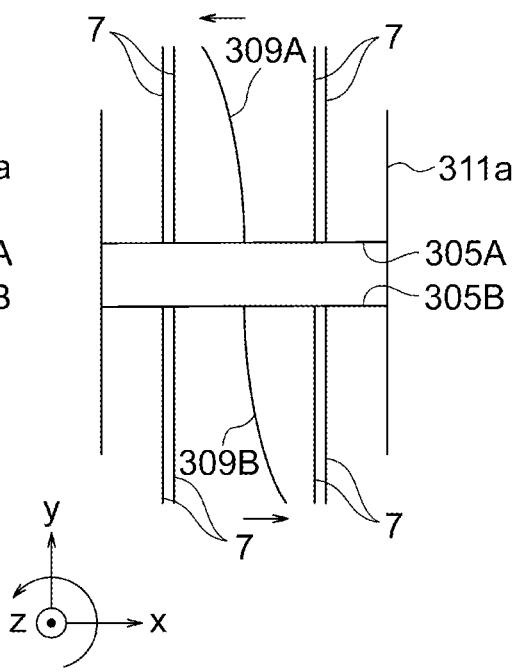

ANGULAR VELOCITY SENSOR AND SENSOR ELEMENT

TECHNICAL FIELD

The present disclosure relates to an angular velocity sensor and a sensor element used in the angular velocity sensor.

BACKGROUND ART

Known in the art (for example Patent Literature 1) is a so-called piezoelectric vibration type angular velocity sensor. In this sensor, an AC voltage is supplied to a piezoelectric body to excite the piezoelectric body. When this excited piezoelectric body is rotated, a Coriolis force having a magnitude in accordance with the rotation speed (angular velocity) is generated in a direction perpendicular to the direction of excitation. The piezoelectric body vibrates by this Coriolis force. Further, by detecting an electrical signal generated in accordance with the deformation of the piezoelectric body due to the Coriolis force, the angular velocity of the piezoelectric body can be detected.

CITATIONS LIST

Patent Literature

Patent Literature 1: Japanese Patent Publication No. 2005-037235

SUMMARY OF INVENTION

An angular velocity sensor according to one aspect of the present disclosure includes a piezoelectric body, a driving circuit which supplies a voltage to the piezoelectric body, and a detecting circuit which detects a signal generated in the piezoelectric body. The piezoelectric body includes a pair of support parts, a frame, a pair of driving arms, and a detecting arm. The pair of support parts are separated from each other in an x-axis direction in an orthogonal coordinate system xyz. The frame includes a main part and a pair of extension parts. The main part extends along the x-axis. The pair of extension parts, when viewed in a z-axis direction, connect two ends of the main part and inner sides of the pair of support parts and include at least parts which extend in directions intersecting the x-axis. The pair of driving arms extend from the main part alongside each other in a y-axis direction at positions separated from each other in the x-axis direction. The detecting arm extends from the main part in the y-axis direction at a position which is between the pair of driving arms in the x-axis direction. The driving circuit supplies to the pair of driving arms voltages with inverse phases from each other making the pair of driving arms vibrate so as to bend to inverse sides from each other in the x-axis direction. The detecting circuit detects the signal generated due to bending deformation of the detecting arm in the z-axis direction or x-axis direction.

A sensor element according to one aspect of the present disclosure includes a piezoelectric body and includes a plurality of excitation electrodes, a plurality of detecting electrodes, and a plurality of wirings all arranged at the piezoelectric body. The piezoelectric body includes a pair of support parts, a frame, a pair of driving arms, and a detecting arm. The pair of support parts are separated from each other in an x-axis direction in an orthogonal coordinate system xyz. The frame includes a main part and a pair of extension parts. The main part extends along the x-axis. The pair of extension parts, when viewed in the z-axis direction, connect two ends of the main part and inner sides of the pair of support parts and include at least parts which extend in directions intersecting the x-axis. The pair of driving arms extend from the main part alongside each other in a y-axis direction at positions separated from each other in the x-axis direction. The pair of detecting arm extends from the main part in the y-axis direction at position which is between the pair of driving arms in the x-axis direction. The plurality of excitation electrodes are provided in an arrangement enabling application of voltages exciting the pair of driving arms in the x-axis direction. The plurality of detecting electrodes are provided in an arrangement enabling detection of signals generated by vibration of the detecting arms in the x-axis direction or z-axis direction. The plurality of wirings connect the plurality of excitation electrodes in connection relationships whereby phases which are inverse from each other making the pair of driving arms vibrate so as to bend to inverse sides from each other in the x-axis direction are supplied from the plurality of excitation electrodes to the pair of driving arms.

BRIEF DESCRIPTION OF DRAWINGS

FIG. 2A is a perspective view showing a portion of the sensor element in FIG. 1 in an enlarged manner, and FIG. 2B is a cross-sectional view taken along the IIb-IIb line in FIG. 2A.

FIG. 8A, FIG. 8B, FIG. 8C, and FIG. 8D are schematic views for explaining the mode of operation of the sensor element in FIG. 6.

DESCRIPTION OF EMBODIMENTS

Below, embodiments according to the present disclosure will be explained with reference to the drawings. The following drawings are schematic ones. Therefore, details will be sometimes omitted. Further, size ratios etc. do not always coincide with the actual ones. Further, size ratios in the plurality of drawings do not always coincide with each other.

Further, for convenience of explanation, an orthogonal coordinate system xyz is attached to each of the drawings. The orthogonal coordinate system xyz is defined based on the shape of the sensor element (piezoelectric body). That is, the x-axis, y-axis, and z-axis do not always indicate an electrical axis, mechanical axis, and optical axis of a crystal. The sensor element may be used so that any direction is defined as "above" or "below". In the following explanation, however, for convenience, sometimes the "upper surface" or "lower surface" and other terms will be used where the positive side in the z-axis direction is the upper part. Further, when simply referred to as "viewed on a plane", it means "viewed in the z-axis direction" unless particularly explained otherwise.

Further, the same or similar configurations are sometimes assigned additional notations of letters of the alphabet which are different from each other such as with the "driving arm 7A" and "driving arm 7B". Further, in this case, sometimes the configurations will be simply referred to as the "driving arms 7" and will not be differentiated.

In the second and following embodiments, configurations which are common or similar to the configurations in the already explained embodiments use notations which were attached to the configurations in the already explained embodiments. Further, sometimes illustration and explanations will be omitted. For configurations corresponding (similar) to the configurations in the already explained embodiments, even in a case where notations which are different from those for the configurations in the already explained embodiments are attached, the matters are the same configurations as those in the already explained embodiments unless particularly explained otherwise.

First Embodiment

Figure 1:
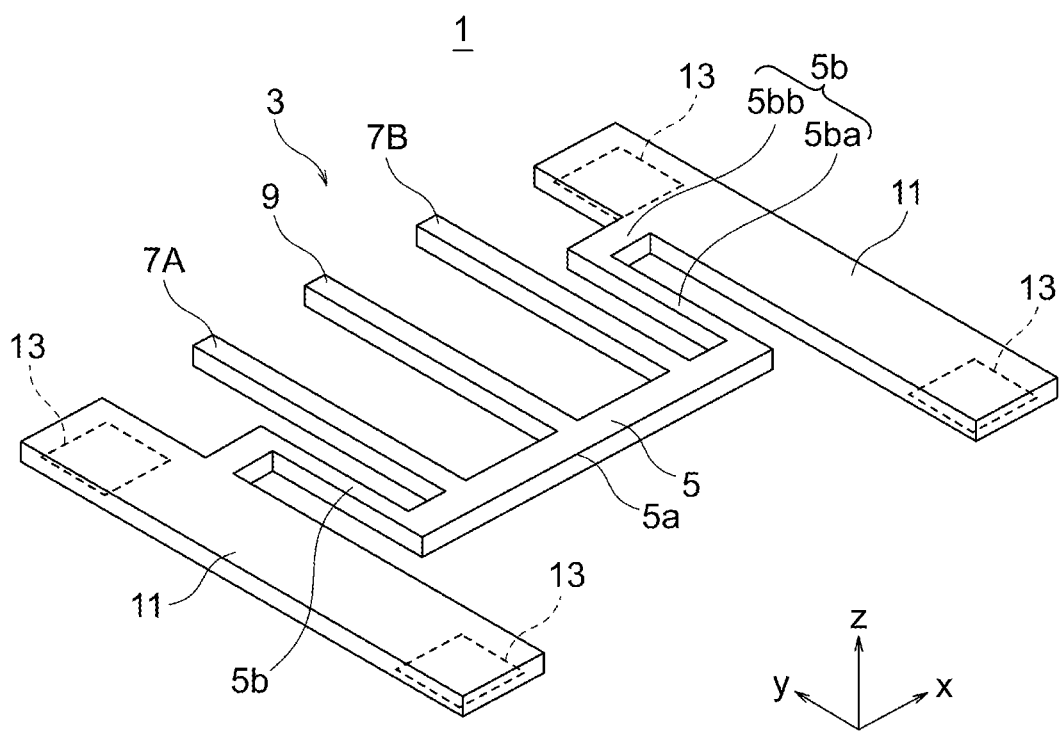
FIG. 1 is a perspective view showing a piezoelectric body in a sensor element according to an embodiment of the present disclosure.

FIG. 1 is a perspective view showing the configuration of a sensor element 1 according to a first embodiment. However, in this view, basically illustration of a conductive layer which is provided on the surface of the sensor element 1 is omitted.

The sensor element 1 for example configures an angular velocity sensor 51 (notation is shown in FIG. 2B) of a piezoelectric vibration type which detects the angular velocity around the x-axis. The sensor element 1 has a piezoelectric body 3. When the piezoelectric body 3 is rotated in a state where voltage is supplied to the piezoelectric body 3 and the piezoelectric body 3 is vibrating, vibration is generated due to a Coriolis force in the piezoelectric body 3. By detecting the electrical signal (for example, voltage or charge) generated due to the vibration by this Coriolis force, the angular velocity is detected. Specifically, this is as follows.

(Shape of Piezoelectric Body)

The piezoelectric body 3 is for example formed integrally as a whole. The piezoelectric body 3 may be a single crystal or may be a polycrystal. Further, the material for the piezoelectric body 3 may be suitably selected. For example, it is a quartz crystal ($SiO_2$), $LiTaO_3$, $LiNbO_3$, PZT, or silicon.

In the piezoelectric body 3, the electrical axis or polarization axis (below, sometimes only the polarization axis will be referred to as representative of the two) is set so as to coincide with the x-axis. Note that, the polarization axis may be inclined relative to the x-axis within a predetermined range (for example 15° or less) as well. Further, in a case where the piezoelectric body 3 is a single crystal, the mechanical axis and optical axis may be made suitable directions. For example, the mechanical axis is made the y-axis direction and the optical axis is made the z-axis direction.

The piezoelectric body 3 is for example made constant in thickness (z-axis direction) as a whole. Further, the piezoelectric body 3 is substantially formed in a line symmetrical shape relative to a not shown symmetrical axis parallel to the y-axis.

The piezoelectric body 3 for example has a frame 5, a pair of driving arms 7A and 7B and a detecting arm 9 which extend from the frame 5 and a pair of mounting arms 11 supporting the frame 5.

The pair of driving arms 7 are portions which are excited by supply of voltage (electric field). The detecting arm 9 is a portion which vibrates due to the Coriolis force and generates an electrical signal in accordance with the angular velocity. The frame 5 is a portion which contributes to support of the driving arms 7 and detecting arm 9 and transfer of vibration from the driving arms 7 to the detecting arm 9. The mounting arms 11 are portions contributing to mounting of the sensor element 1 on a not shown mounting body (for example a portion of a package or circuit board).

The frame 5 for example has a long shape as a whole and is arranged bridging the pair of mounting arms 11. Accordingly, the frame 5, when viewed on a plane, becomes able to flexurally deform like a beam supported at its two ends.

The frame 5 for example has a main part 5a on the center side and a pair of extension parts 5b which are positioned at the two ends of the main part 5. The main part 5a is the portion to which the pair of driving arms 7 and detecting arm 9 are connected. The pair of extension parts 5b are portions which are connected to inner sides of the pair of mounting arms 11 (surfaces of the pair of mounting arms 11 which face each other).

In contrast to the main part 5a extending along the x-axis (facing direction of pair of mounting arms 11), the pair of extension parts 5b extend in at least part in a direction intersecting the x-axis. Accordingly, the frame 5 becomes longer compared with a case where the entirety thereof extends along the x-axis. As a result, the frame 5 becomes easier to flexurally deform when viewed on a plane.

The main part 5a for example linearly extends. The shape of the transverse cross-section of the main part 5a is for example substantially constant over the whole length and further is substantially rectangular. Either of the width (y-axis direction) or thickness (z-axis direction) of the main part 5a may be larger than the other as well The extension parts 5b for example have extending main portions 5ba which extend from the main part 5a linearly along the y-axis (in parallel to the y-axis) and connection portions 5bb which connect the extending main portions 5ba and the mounting arms 11.

The shapes of the transverse cross-sections of the extending main portions 5ba are for example substantially constant over the whole lengths and are substantially rectangular. Either of the widths (x-axis direction) or thicknesses (z-axis direction) of the extending main portions 5ba may be larger than the other as well. The widths of the extending main portions 5ba may be larger than, equal to (example shown), or smaller than the widths of the main parts 5a.

The connection portions 5bb for example extend linearly along the x-axis (in parallel to the x-axis). Further, the shapes of the transverse cross-sections of the connection portions 5bb are substantially constant over the whole lengths, and further are substantially rectangular. Either of the widths (y-axis direction) or thicknesses (z-axis direction) of the connection portions 5bb may be larger than the other as well. The widths of the connection portions 5bb may be larger than, equal to (example shown), or smaller than the widths of the extending main portions 5ba.

The various dimensions of the frame 5 may be suitably set. The frame 5, as will be explained later, is designed to flexurally deform when viewed on a plane. Accordingly, the width of the frame 5 may be made relatively small. For example, the widths of the main part 5*a*, extending main portions 5*ba*, and/or connection portions 5*bb* may be made not more than the widths (x-axis direction) of the mounting arms 11 or less than the widths of the mounting arms 11. In the example shown, the width at any position in the frame 5 is smaller than the widths of the mounting arms 11. Further, for example, the widths of the main part 5*a*, extending main portions 5*ba*, and connection portions 5*bb* may be made 2 times or less or 1 time or less of the thickness of the frame 5. Further, for example, the length and width of the frame 5 may be adjusted so that the natural frequency of the flexural deformation when viewed on a plane becomes closer to the natural frequency of the driving arms 7 in a direction in which they are excited by application of voltage and/or the natural frequency of the detecting arm 9 in a direction in which it vibrates due to the Coriolis force.

The driving arms 7 extend from the frame 5 (main part 5*a*) in the y-axis direction. Their front ends are formed as free ends. Accordingly, the driving arms 7 become able to flexurally deform in a cantilever manner. The pair of driving arms 7 extend alongside each other (for example in parallel) at positions separated from each other in the x-axis direction. The pair of driving arms 7 are for example provided at positions line symmetrical relative to a not shown symmetrical axis which passes the center of the frame 5 and is parallel to the y-axis.

As will be explained later (FIG. 3A and FIG. 3B), the pair of driving arms 7 are intended to make the frame 5 flexurally deform (vibrate) when viewed on a plane by excitation in the x-axis direction. Accordingly, for example, the positions of the pair of driving arms 7 in the x-axis direction relative to the frame 5 may be suitably set so that the flexural deformation of the frame 5 becomes large due to vibration of the pair of driving arms 7. For example, when equally dividing the length of the frame 5 in the x-axis direction into three parts, the pair of driving arms 7 are respectively positioned in the regions on the two sides.

The specific shapes etc. of the driving arms 7 may be suitably set. For example, the driving arms 7 are made long rectangular cuboid shapes. That is, the cross-sectional shape (xz plane) is rectangular. Although not particularly shown, the driving arms 7 may be hammer shaped with widths (x-axis direction) becoming broader at the front end side portion as well. The pair of driving arms 7 are for example substantially mutually symmetrically shaped and sized. Accordingly, the vibration characteristics of the two are equal to each other.

The driving arms 7 are excited in the x-axis direction as will be explained later. Accordingly, in the driving arms 7, the larger the width (x-axis direction), the higher the natural frequency in the excitation direction (x-axis direction). Further, the larger the length (mass from another viewpoint), the lower the natural frequency in the excitation direction. The various dimensions of the driving arms 7 are for example set so that the natural frequency in the excitation direction of the driving arms 7 becomes close to the frequency at which excitation is desired be caused.

The detecting arm 9 extends from the frame 5 (main part 5*a*) in the y-axis direction. Its front end is made a free end. Accordingly, the detecting arm 9 becomes able to flexurally deform in a cantilever manner. Further, the detecting arm 9 extends between the pair of driving arms 7 alongside (for example in parallel with) the pair of driving arms 7. The detecting arm 9 is for example positioned at the center in the x-axis direction of the frame 5 and/or positioned at the center between the pair of driving arms 7.

The specific shape etc. of the detecting arm 9 may be suitably set. For example, the detecting arm 9 is made a long rectangular cuboid shape. That is, the cross-sectional shape (xz plane) is rectangular. The detecting arm 9 may be hammer shaped with a width (x-axis direction) becoming broader at the front end side portion as well (see detecting arm 309 in FIG. 6 which will be explained later).

The detecting arm 9, as will be explained later, in the present embodiment, vibrates in the z-axis direction due to the Coriolis force. Accordingly, in the detecting arm 9, the larger the thickness (z-axis direction), the higher the natural frequency in the vibration direction (z-axis direction). Further, the larger the length (mass from another viewpoint), the lower the natural frequency in the vibration direction. The various dimensions of the detecting arm 9 are for example set so that the natural frequency in the vibration direction of the detecting arm 9 becomes close to the natural frequency in the excitation direction of the driving arms 7. The length of the detecting arm 9 is for example equal to the lengths of the driving arms 7. However, the two may be different as well.

The pair of mounting arms 11 are for example formed in shapes having the y-axis direction as the long directions. More specifically, for example, the mounting arms 11 are plate shaped having rectangular planar shapes so that the z-axis direction becomes the thickness direction. The widths (x-axis direction) of the mounting arms 11 are for example broader than the width of the frame 5 as explained above. Further, they are broader than the widths (x-axis direction) of the driving arms 7 and the width (x-axis direction) of the detecting arm 9. Accordingly, the mounting arms 11 become harder to flexurally deform (vibration) when viewed on a plane compared with the other portions (5, 7, and 9). However, the mounting arms 11, in part or whole, may be made narrower in width compared with any of the other portions as well. The lengths of the mounting arms 11 may be suitably set.

The lower surfaces of the pair of mounting arms 11 are provided with at least four pads 13. The pads 13 face not shown pads provided on a mounting body and are bonded with the pads on the mounting body by bumps made of solder or a conductive adhesive. Due to this, electrical connection of the sensor element 1 and the mounting body is achieved. Further, the sensor element 1 (piezoelectric body 3) is supported in a state where the driving arms 7 and detecting arm 9 can vibrate. The four pads 13 are for example provided on the two ends in the pair of mounting arms 11.

(Excitation Electrodes, Detecting Electrode, and Wirings)

FIG. 2A is a perspective view showing a portion of the sensor element 1 in an enlarged manner. Further, FIG. 2B is a cross-sectional view taken along the IIb-IIb line in FIG. 2A.

The sensor element 1 has excitation electrodes 15A and 15B for supplying voltages to the driving arms 7, detecting electrodes 17A and 17B for extracting signals generated in the detecting arm 9, and a plurality of wirings 19 connecting them. They are configured by conductor layers formed on the surface of the piezoelectric body 3. The materials for the conductor layers are for example Cu, Al, or another metal.

The additional notations A and B of the excitation electrodes 15 and detecting electrodes 17 are attached based on the orthogonal coordinate system xyz. Accordingly, as will be explained later, the excitation electrode 15A on one driving arm 7 and the excitation electrode 15A on the other driving arm 7 do not always have the same potential. The same is true for the excitation electrodes 15B. The same is true for the detecting electrodes 17A and 17B in an aspect (embodiment which will be explained later) where a plurality of detecting arms 9 are provided.

At each of the driving arms 7, the excitation electrodes 15A are provided at the upper surface and lower surface (a pair of surfaces facing the two sides in the z-axis direction). Further, at each of the driving arms 7, the excitation electrodes 15B are provided at a pair of side surfaces (a pair of surfaces facing the two sides in the x-axis direction).

In the embodiments which will be explained later, sometimes provision is made of driving arms 7 which extend from the frame 5 toward the negative side in the y-axis direction. In such driving arms 7 as well, the additional notations "A" of the excitation electrodes 15 correspond to the upper surfaces and lower surfaces, and the additional notations "B" of the excitation electrodes 15 correspond to the side surfaces.

On the upper, lower, left, and right surfaces of each of the driving arms 7, the excitation electrodes 15 are for example formed so as to cover majorities of the surfaces. However, at least one of each two excitation electrodes 15A and 15B (excitation electrodes 15A in the present embodiment) is formed smaller in the width direction than the surface so that the electrodes are not short-circuited with each other. Further, parts of the root sides and front end sides of the driving arms 7 may be made positions where no excitation electrodes 15 are arranged.

At each of the driving arms 7, the two excitation electrodes 15A are for example rendered the same potentials as each other. For example, the two excitation electrodes 15A are connected to each other by the wiring 19. Further, at each of the driving arms 7, the two excitation electrodes 15B are for example rendered the same potentials as each other. For example, the two excitation electrodes 15B are connected to each other by the wiring 19.

In such an arrangement and connection relationships of the excitation electrodes 15, if voltage is supplied between the excitation electrodes 15A and the excitation electrodes 15B, for example, in the driving arm 7, an electric field heading from the upper surface toward the pair of side surfaces (two sides in the x-axis direction) and an electric field heading from the lower surface toward the pair of side surfaces are generated. On the other hand, the polarization axis matches with the x-axis direction. Accordingly, when focusing on the components in the x-axis direction of the electric fields, in the driving arm 7, the orientation of the electric field and the orientation of the polarization axis match in one side portion of the x-axis direction, while the orientation of the electric field and the orientation of the polarization axis become inverse to each other in the other side portion.

As a result, the one side portion of the driving arm 7 in the x-axis direction contracts in the y-axis direction, and the other side portion extends in the y-axis direction. Further, the driving arm 7 flexes to one side in the x-axis direction like a bimetal. If the voltage supplied to the excitation electrodes 15A and 15B is inverted, the driving arm 7 flexes to an inverse direction. According to such a principle, if an AC voltage is supplied to the excitation electrodes 15A and 15B, the driving arm 7 vibrates in the x-axis direction.

Although particularly not shown, one or more recessed grooves extending along the long direction of the driving arm 7 (the recessed groove may be configured by a plurality of concave portions arranged in the long direction of the driving arm 7 as well) may be provided in the upper surface and/or lower surface of the driving arm 7, and the excitation electrodes 15A may be provided over the interiors of these recessed grooves. In this case, the excitation electrodes 15A and the excitation electrodes 15B face in the x-axis direction while sandwiching the wall portions of the recessed grooves therebetween, therefore the efficiency of excitation is improved.

Between the pair of driving arms 7, the excitation electrodes 15A on the driving arm 7A and the excitation electrodes 15B on the driving arm 7B are given the same potential, while the excitation electrodes 15B on the driving arm 7A and the excitation electrodes 15A on the driving arm 7B are given the same potential. The excitation electrodes 15 which must be given the same potential are for example connected to each other by the wirings 19.

If applying AC voltage between the excitation electrodes 15A and the excitation electrodes 15B in such connection relationships, voltages having inverse phases from each other are supplied to the pair of driving arms 7, therefore the pair of driving arms 7 vibrate so as to flexurally deform in reverse orientations to each other in the x-axis direction.

The detecting electrodes 17A in the detecting arm 9 are provided in a region on the positive side in the z-axis direction (for example, the side more positive than the center of the surface) in the surface facing the negative side in the x-axis direction and in a region on the negative side in the z-axis direction (for example, the side more negative than the center of the surface) in the surface facing the positive side in the x-axis direction. The detecting electrodes 17B in the detecting arm 9 are provided in a region on the negative side in the z-axis direction (for example, the side more negative than the center of the surface) in the surface facing the negative side in the x-axis direction and in a region on the positive side in the z-axis direction (for example, the side more positive than the center of the surface) in the surface facing the positive side in the x-axis direction.

In the embodiments which will be explained later, sometimes provision is made of a detecting arm 9 which extends from the frame 5 to the negative side in the y-axis direction. In such a detecting arm 9 as well, the additional notations "A" of the detecting electrodes 17 show the region of +z in the side surface of −x and the region of −z in the side surface of +x, while the additional notations "B" of the detecting electrodes 17 show the region of −z in the side surface of −x and the region of +z in the side surface of +x.

At each of the side surfaces of the detecting arm 9, the detecting electrodes 17A and 17B extend along the detecting arm 9 so that they are separated by suitable interval so as not to short-circuit with each other. The two detecting electrodes 17A are for example connected with each other by the wiring 19. Further, the two detecting electrodes 17B are for example connected with each other by the wiring 19.

In such an arrangement and connection relationships of the detecting electrodes 17, if the detecting arm 9 flexurally deforms in the z-axis direction, for example, electric fields parallel to the z-axis direction are generated. That is, at each of the side surfaces of the detecting arm 9, voltage is generated between the detecting electrode 17A and the detecting electrode 17B. The orientations of the electric fields are determined by the orientation of the polarization axes and the orientation of flexes (positive side or negative side in the z-axis direction), and are inverse to each other between the positive side portion and the negative side portion in the x-axis direction. These voltages (electric fields) are output to the detecting electrodes 17A and the detecting electrodes 17B. When the detecting arm 9 vibrates in the z-axis direction, the voltages are detected as the AC voltage. Among the electric fields, electric fields parallel to the z-axis direction may be dominant as described above or a ratio of the electric fields which are parallel to the x-axis direction and have inverse orientations to each other between the positive side portion and the negative side portion in the z-axis direction may be larger. In any case, voltages in accordance with the flexural deformation of the detecting arm 9 in the z-axis direction are generated between the detecting electrodes 17A and the detecting electrodes 17B.

The plurality of wirings 19 connect the excitation electrodes 15 and detecting electrodes 17 as explained above. Further, the plurality of wirings 19 connect four sets of electrodes in total and the four pads 9. The four sets of electrodes are comprised of the excitation electrodes 15 which are divided into two sets from a viewpoint of potentials and the detecting electrodes 17 which are divided into two sets from a viewpoint of potentials. By suitable arrangement of the plurality of wirings 19 on the upper surfaces, lower surfaces, and/or side surfaces of various parts in the piezoelectric body 3, the connections explained above can be realized without short-circuiting with each other in a mode where the entireties of wirings 19 are provided on the surfaces of the piezoelectric body 3. However, three-dimensional interconnect portions may be formed by providing insulation layers on the wirings 19 positioned on the piezoelectric body 3 and providing other wirings 19 above the insulation layers.

As shown in FIG. 2B, the angular velocity sensor 51 has a driving circuit 103 supplying voltages to the excitation electrodes 15 and a detecting circuit 105 detecting electrical signals from the detecting electrodes 17.

The driving circuit 103 is for example configured including an oscillation circuit and amplifier and supplies an AC voltage having a predetermined frequency between the excitation electrodes 15A and the excitation electrodes 15B. The frequency may be determined in advance in the angular velocity sensor 51 or may be designated from an external apparatus or the like.

The detecting circuit 105 is for example configured including an amplifier and wave detecting circuit, detects a potential difference between the detecting electrode 17A and the detecting electrode 17B, and outputs an electrical signal in accordance with the detection result to an external apparatus or the like. More specifically, for example, the potential difference described above is detected as the AC voltage, and the detecting circuit 105 outputs a signal in accordance with the amplitude of the detected AC voltage. The angular velocity is identified based on this amplitude. Further, the detecting circuit 105 outputs a signal in accordance with a phase difference between the applied voltage of the driving circuit 103 and the electrical signal which was detected. The orientation of rotation is identified based on this phase difference.

The driving circuit 103 and detecting circuit 105 configure a control circuit 107 as a whole. The control circuit 107 is for example configured by a chip IC (integrated circuit) and is mounted on a circuit board or a mounting body having a suitable shape and on which the sensor element 1 is mounted.

(Operation of Angular Velocity Sensor)

Figure 3A:
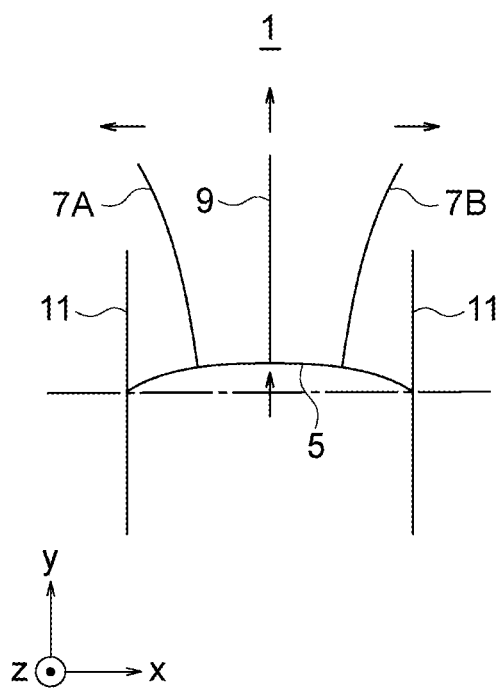
FIG. 3A, FIG. 3B, FIG. 3C, and FIG. 3D are schematic views for explaining the mode of operation of the sensor element in FIG. 1.
Figure 3B:
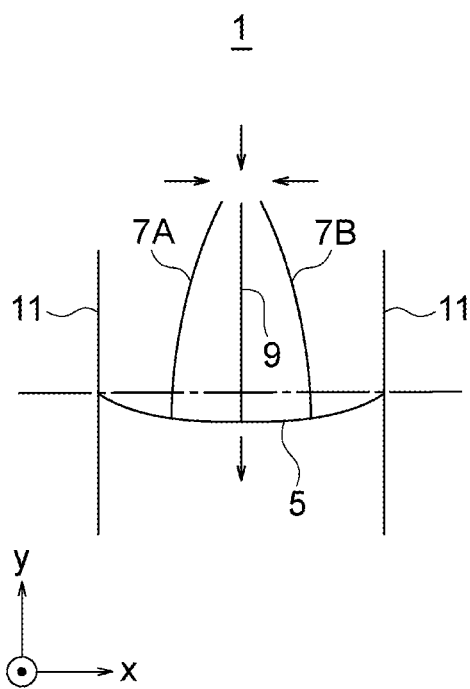

FIG. 3A and FIG. 3B are schematic plan views for explaining excitation of the piezoelectric body 3. In the two views, phases of AC voltages supplied to the excitation electrodes 15 are offset by 180° from each other. In these schematic views, the frame 5 is drawn as straight shapes.

As explained above, the driving arms 7A and 7B are excited with inverse phases from each other so as to deform in inverse orientations to each other in the x-axis direction by application of AC voltages to the excitation electrodes 15.

At this time, as shown in FIG. 3A, if the pair of driving arms 7 flex to the outer sides in the x-axis direction relative to each other (sides where the pair of driving arms are separated from each other), the bending moments thereof are transferred to the frame 5, and the frame 5 flexes to the positive side in the y-axis direction. As a result, the detecting arm 9 is displaced to the positive side in the y-axis direction.

Conversely, as shown in FIG. 3B, if the pair of driving arms 7 flex to the inner sides in the x-axis direction relative to each other (sides where the pair of driving arms become closer to each other), the bending moments thereof are transferred to the frame 5, and the frame 5 is displaced to the negative side in the y-axis direction. As a result, the detecting arm 9 is displaced to the negative side in the y-axis direction.

Accordingly, due to excitation of the pair of driving arms 7, the detecting arm 9 vibrates in the y-axis direction.

Figure 3C:
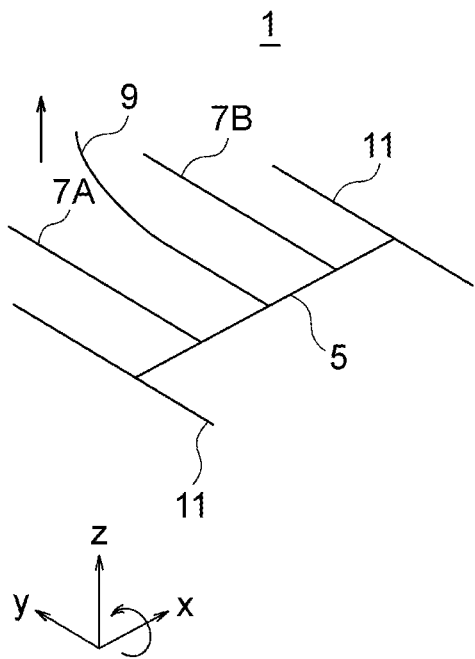
Figure 3D:
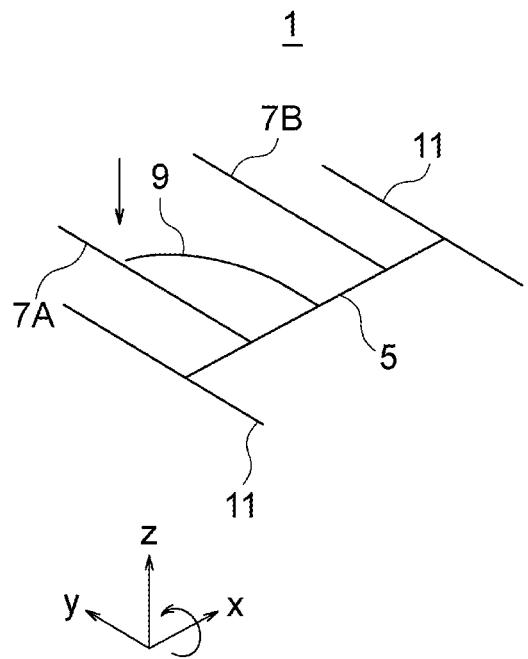

FIG. 3C and FIG. 3D are schematic perspective views for explaining the vibration of the detecting arm 9 due to the Coriolis force. FIG. 3C and FIG. 3D correspond to the states in FIG. 3A and FIG. 3B. In these views, illustration of deformations of the driving arms 7 and frame 5 is omitted.

If the sensor element 1 is rotated around the x-axis in a state where the piezoelectric body 3 is vibrating as explained with reference to FIG. 3A and FIG. 3B, the detecting arm 9 vibrates (is deformed) in the direction (z-axis direction) perpendicular to the rotation axis (x-axis) and to the vibration direction (y-axis) due to the Coriolis force since it is vibrating (displaced) in the y-axis direction. The signal (voltage) generated due to this deformation is extracted by the detecting electrodes 17 as explained above. The larger the angular velocity, the larger the Coriolis force (in turn the voltage of the detected signal). Due to this, the angular velocity is detected.

As described above, the angular velocity sensor 51 has the piezoelectric body 3, driving circuit 103, and detecting circuit 105. The piezoelectric body 3 has the pair of mounting arms 11, frame 5, pair of driving arms 7, and detecting arm 9. The pair of mounting arms 11 are separated from each other in the x-axis direction in the orthogonal coordinate system xyz. The frame 5 includes the main part 5a and the pair of extension parts 5b. The main part 5a extends along the x-axis. When viewed in the z-axis direction, the pair of extension parts 5b connect the two ends of the main part 5a and the inner sides of the pair of mounting arms 11, and at least parts of the pair of extension parts 5b extend in the direction intersecting the x-axis. The pair of driving arms 7 extend from the main part 5a alongside each other in the y-axis direction at positions separated from each other in the x-axis direction. The detecting arm 9 extends from the main part 5a in the y-axis direction at the position between the pair of driving arms 7 in the x-axis direction. The driving circuit 103 supplies voltages with inverse phases from each other to the pair of driving arms 7 so that the pair of driving arms 7 vibrate so as to bend to inverse sides from each other in the x-axis direction. The detecting circuit 105 detects the signal generated due to the bending deformation in the z-axis direction or x-axis direction (z-axis direction in the present embodiment) of the detecting arm 9.

From another viewpoint, the sensor element 1 has a piezoelectric body 3, a plurality of excitation electrodes 15, a plurality of detecting electrodes 17, and a plurality of wirings 19. The piezoelectric body 3 has a pair of mounting arms 11, a frame 5, a pair of driving arms 7, and a detecting arm 9. The pair of mounting arms 11 are separated from each other in the x-axis direction in the orthogonal coordinate system xyz. The frame 5 includes a main part 5a and a pair of extension parts 5b. The main part 5a extends along the x-axis. When viewed in the z-axis direction, the pair of extension parts 5b connect the two ends of the main part 5a and the inner sides of the pair of mounting arms 11, and at least parts of the pair of extension parts 5b extend in the direction intersecting the x-axis. The pair of driving arms 7 extend from the main part 5a alongside each other in the y-axis direction at positions separated from each other in the x-axis direction. The detecting arm 9 extends from the main part 5a in the y-axis direction at a position between the pair of driving arms 7 in the x-axis direction. The plurality of excitation electrodes 15 are provided in an arrangement enabling application of voltages exciting the pair of driving arms 7 in the x-axis direction. The plurality of detecting electrodes 17 are provided in an arrangement enabling detection of a signal generated by vibration in the z-axis direction or x-axis direction (z-axis direction in the present embodiment) of the detecting arm 9. The plurality of wirings 19 connect the plurality of excitation electrodes 15 so that mutually inverse phases are supplied from the plurality of excitation electrodes 15 to the pair of driving arms 7 so that the pair of driving arms 7 vibrate so as to bend to inverse sides from each other in the x-axis direction.

Accordingly, detection according to a new vibration mode where the frame 5 is made to flex (vibrate) by excitation of the pair of driving arms 7 to make the detecting arm 9 displace (vibrate) and the angular velocity is detected by the Coriolis force acting upon this displaced detecting arm 9 becomes possible. The frame 5 includes portions (extending portions 5b) which extend in the direction intersecting the x-axis. Therefore, for example, compared with the mode where the frame 5 linearly extends between the pair of mounting arms 11 (such a mode is new as well), it easily flexes. As a result, for example, it becomes easy to achieve both improvement of detection sensitivity and reduction of size.

As a comparative example, for example, making the Coriolis force act upon the driving arms being excited to make them vibrate and transferring vibrations due to this Coriolis force to the detecting arm can be mentioned. In the present embodiment, unlike such a comparative example, the Coriolis force directly acts upon the detecting arm. As a result, for example the detection sensitivity is improved.

Further, as a comparative example, for example, there can be mentioned a mode where the detecting arm is flexurally deformed (vibrates) in the same direction as the vibration direction (x-axis direction) of the driving arms, and the Coriolis force is made act upon this vibrating detecting arm. In the present embodiment, the vibration direction of the detecting arm is different from such a mode. It becomes possible to detect the angular velocity about the rotation axis (x-axis) for which the angular velocity could not be detected in the comparative example explained before.

Further, in the present embodiment, the detecting arm 9 is positioned at the center between the pair of driving arms 7.

The flexural deformation of the frame 5 is apt to become larger at the center between the pair of driving arms 7. By the detecting arm 9 being positioned at such a position, the amplitude of the detecting arm 9 is made large and the detection sensitivity can be made larger. In particular, in a case of an arrangement where the pair of driving arms 7 and the two ends of the frame 5 (supported positions) are line symmetrical relative to the same symmetrical axis, the amplitude of the detecting arm 9 can be made the largest. In the above, as a comparative example, a technique of causing the detecting arm 9 to flexurally deform (vibrate) in the vibration direction of the driving arms and making the Coriolis force act upon that vibrating detecting arm was referred to. In this comparative example, in principle thereof, for example, a pair of detecting arms are arranged line symmetrical relative to the center between the pair of driving arms or one driving arm and one detecting arm are arranged in a tuning fork manner.

Further, in the present embodiment, the piezoelectric body 3 has only one pair of driving arms 7 as the arms which extend from the frame 5 and are supplied with voltages and vibrate (as will be explained later, it is also possible to provide another driving arm 7 which extends alongside the pair of driving arms 7). That is, another driving arm which extends from the frame 5 to the opposite side to the driving arms 7 (in the example shown, the negative side in the y-axis direction) is not provided.

Accordingly, for example, flexural deformation can be reliably caused in the frame 5 by the pair of driving arms 7. In the comparative example, sometimes the detecting arm is positioned at the center of the pair of driving arms (see Patent Literature 1). In this case, in the comparative example, for example, another pair of driving arms which extend to the opposite side to the pair of driving arms are provided, and the other pair of driving arms are excited with the same phase as that of the pair of driving arms. That is, in the base part corresponding to the frame 5, flexing as in the present embodiment is prevented from occurring.

Second Embodiment (Configuration of Angular Velocity Sensor)

Figure 4A:
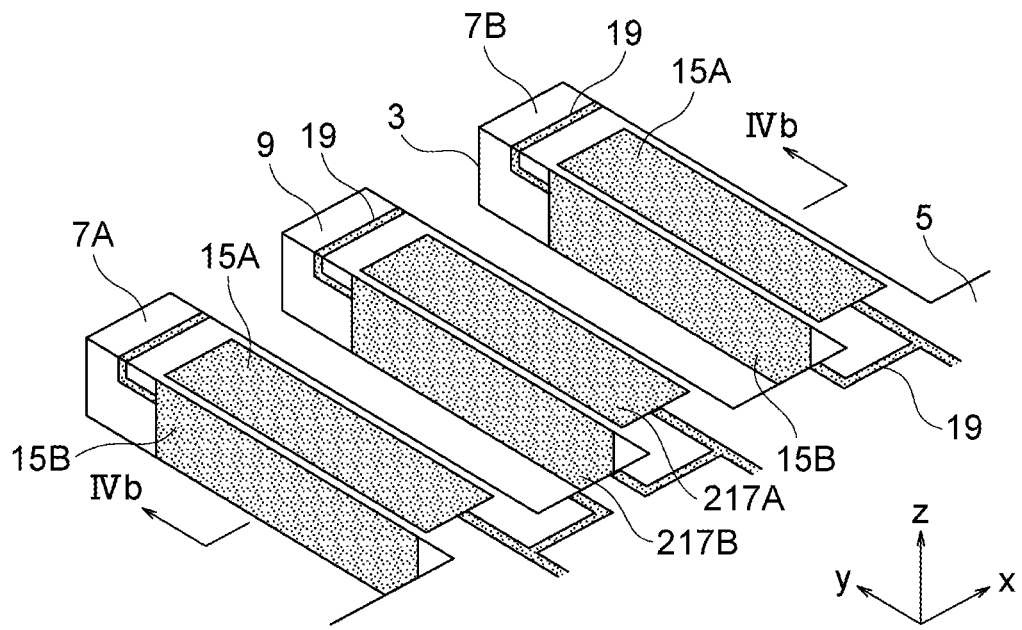
FIG. 4A is a perspective view showing a portion of a sensor element according to a second embodiment in an enlarged manner.
Figure 4B:
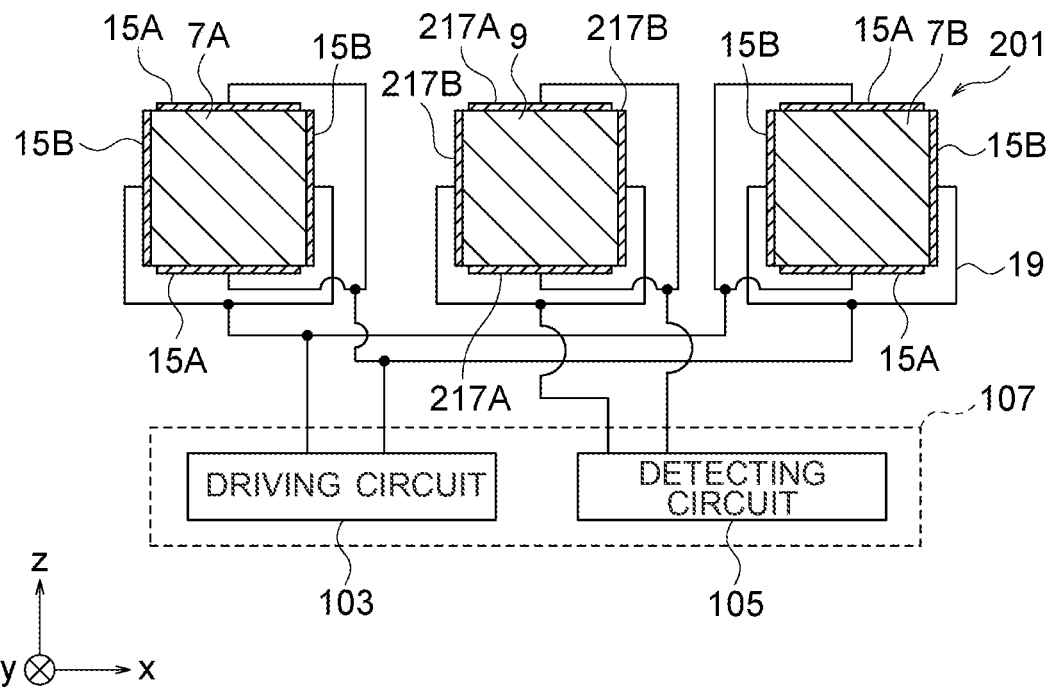
FIG. 4B is a cross-sectional view taken along the IVb-IVb line in FIG. 4A.

FIG. 4A is a perspective view the same as FIG. 2A and shows a portion of a sensor element 201 according to a second embodiment in an enlarged manner. FIG. 4B is a view the same as FIG. 2B which shows an angular velocity sensor 251 according to the second embodiment and includes a cross-sectional view corresponding to the IVb-IVb line in FIG. 4A.

The angular velocity sensor 251 according to the second embodiment, in the same way as the angular velocity sensor 51 according to the first embodiment, causes the pair of driving arms 7 to vibrate in the x-axis direction and thereby make the frame 5 flex (vibrate) and in turn make the detecting arm 9 displace (vibrate) in the y-axis direction. Further, the Coriolis force is made to directly act upon the detecting arm 9. However, in contrast to the angular velocity sensor 51 detecting rotation around the x-axis, the angular velocity sensor 251 is one detecting rotation around the z-axis. Specifically, this is as follows.

The sensor element 201 has a piezoelectric body 3, a plurality of excitation electrodes 15, a plurality of detecting electrodes 217, a plurality of pads 13 (not shown here), and a plurality of wirings 19. As will be understood from these notations, except for the plurality of detecting electrodes 217 (wirings 19 concerned with them), the fundamental configuration of the sensor element 201 may be made substantially the same as that of the sensor element 1 in the first embodiment. FIG. 1 may be grasped as a perspective view showing the sensor element 201.

However, in the present embodiment, unlike the first embodiment, the detecting arm 9 is intended to vibrate in the x-axis direction due to the Coriolis force. Based on such a difference, various dimensions may be different from those in the first embodiment.

For example, in the detecting arm 9, the larger the width (x-axis direction), the higher the natural frequency in the vibration direction (x-axis direction). Further, the larger the length (mass from another viewpoint), the lower the natural frequency in the vibration direction. The various dimensions of the detecting arm 9 are for example set so that the natural frequency in the vibration direction of the detecting arm 9 becomes close to the natural frequency in the excitation direction of the driving arms 7. For example, the length and width of the detecting arm 9 are equal to the lengths and widths of the driving arms 7. However, the dimensions of the two may be different as well.

The detecting electrodes 217A and 271B extract signals generated due to bending deformation in the x-axis direction of the detecting arm 9. Therefore, for example, the detecting electrodes 217A and 271B are configured the same as those of the excitation electrodes 15A and 15B for exciting the driving arms 7 in the x-axis direction. Accordingly, the explanation for the excitation electrodes 15 in the first embodiment may be made the explanation for the detecting electrodes 217 by replacing the term "excitation electrodes 15" with "detecting electrodes 217". The same is true for the mutual connection of the pair of detecting electrodes 217A and mutual connection of the pair of detecting electrodes 217B.

The explanation for the first embodiment referred to the fact that recessed grooves in which the excitation electrodes 15A are arranged may be provided in the upper surfaces and/or lower surfaces of the driving arms 7. In the same way, in the detecting arm 9 in the second embodiment, a recessed groove in which the detecting electrode 217A is arranged may be provided in the upper surface and/or lower surface.

(Operation of Angular Velocity Sensor)

The excitation of the piezoelectric body 3 in the second embodiment is the same as that in the first embodiment. FIG. 3A and FIG. 3B may be grasped as views showing the excitation state of the piezoelectric body 3 in the second embodiment. Accordingly, the pair of driving arms 7 vibrate so as to become closer to or separate from each other in the x-axis direction, and the detecting arm 9 is displaced (vibrates) in the y-axis direction.

Figure 5A:
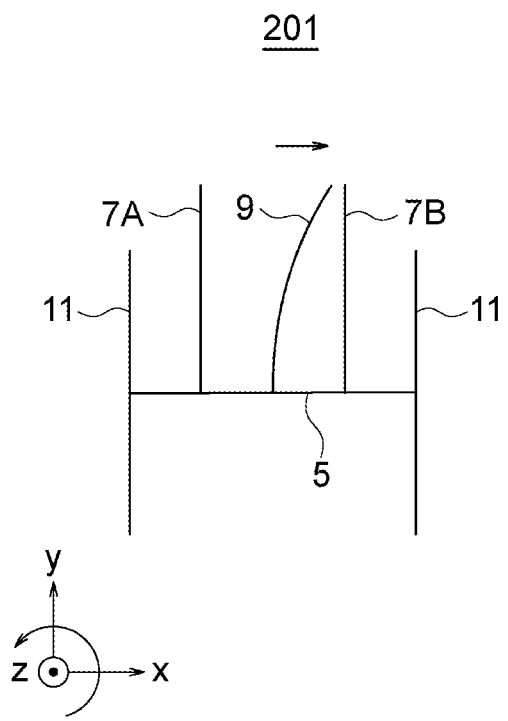
FIG. 5A and FIG. 5B are schematic views for explaining the mode of operation of the sensor element in FIG. 4A.
Figure 5B:
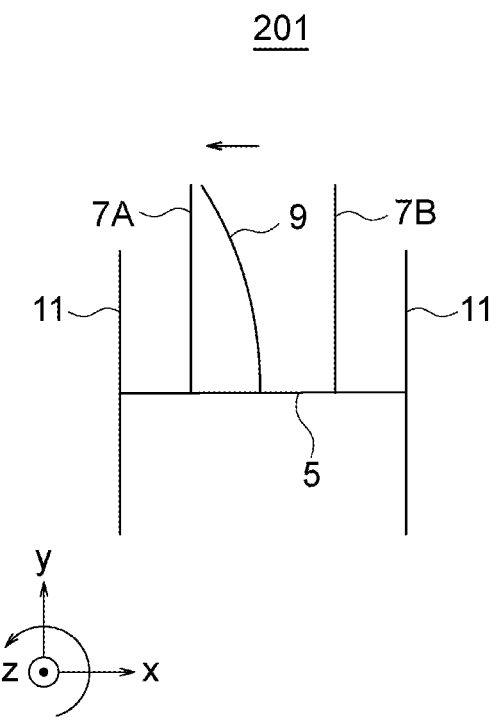

FIG. 5A and FIG. 5B are schematic plan views for explaining the vibration of the detecting arm 9 due to the Coriolis force. FIG. 5A and FIG. 5B correspond to the states in FIG. 3A and FIG. 3B.

If the sensor element 1 is rotated around the z-axis in the state where the piezoelectric body 3 is vibrating as explained with reference to FIG. 3A and FIG. 3B, the detecting arm 9 vibrates (deforms) in the direction (x-axis direction) perpendicular to the rotation axis (z-axis) and to the vibration direction (y-axis) due to the Coriolis force since the detecting arm 9 is vibrating (displaced) in the y-axis direction. The signal (for example voltage) generated by this deformation is extracted by the detecting electrodes 217 and is input to the detecting circuit 105. The larger the angular velocity, the larger Coriolis force (in turn the voltage of the extracted signal). Due to this, the angular velocity is detected.

As described above, in the present embodiment as well, the frame 5 is arranged bridging the pair of mounting arms 11 which are separated from each other in the x-axis direction, the driving arms 7 extend from the main part 5a in the frame 5 alongside each other in the y-axis direction at positions where they are separated from each other in the x-axis direction, the detecting arm 9 extends from the main part 5a in the y-axis direction at the position between the pair of driving arms 7 in the x-axis direction, the driving circuit 103 supplies voltages with inverse phases from each other to the pair of driving arms 7 so that the pair of driving arms 7 vibrate so as to bend to inverse sides from each other in the x-axis direction (plurality of excitation electrodes 15 are arranged so that such voltage application is possible), and the detecting circuit 105 detects the signal generated by the bending deformation in a suitable direction (x-axis direction in the present embodiment) of the detecting arm 9 (plurality of detecting electrodes 217 are arranged so that such detection is possible).

Accordingly, the same effects as those by the first embodiment are exhibited. For example, detection according to the new mode of vibration becomes possible. Further, for example, the Coriolis force directly acts upon the detecting arm, so improvement of the detection sensitivity can be expected. Further, for example, in the comparative example in which the detecting arm was bent and deformed (vibrated) in the same direction as the vibration direction (x-axis direction) of the driving arms and the Coriolis force was made act upon this vibrating detecting arm, it was not possible to detect the angular velocity about the axis (z-axis). Here, it becomes possible to detect that angular velocity.

Third and Fourth Embodiments

As understood from the first and second embodiments, in the present disclosure, when comparing an angular velocity sensor which detects rotation around the x-axis and an angular velocity sensor which detects rotation around the z-axis, among the configurations of the two, basically only the configurations of the detecting electrodes 17 and 217 (and wirings 19 concerned with them) are different. In their modes of operation, only the directions in which the Coriolis forces act are different. Therefore, an angular velocity sensor according to a third embodiment which detects rotation around the x-axis and an angular velocity sensor according to a fourth embodiment which detects rotation around the z-axis will be explained together. In the explanation, sometimes the notations of the two will be attached to the same drawing.

(Configuration of Angular Velocity Sensor)

Figure 6:
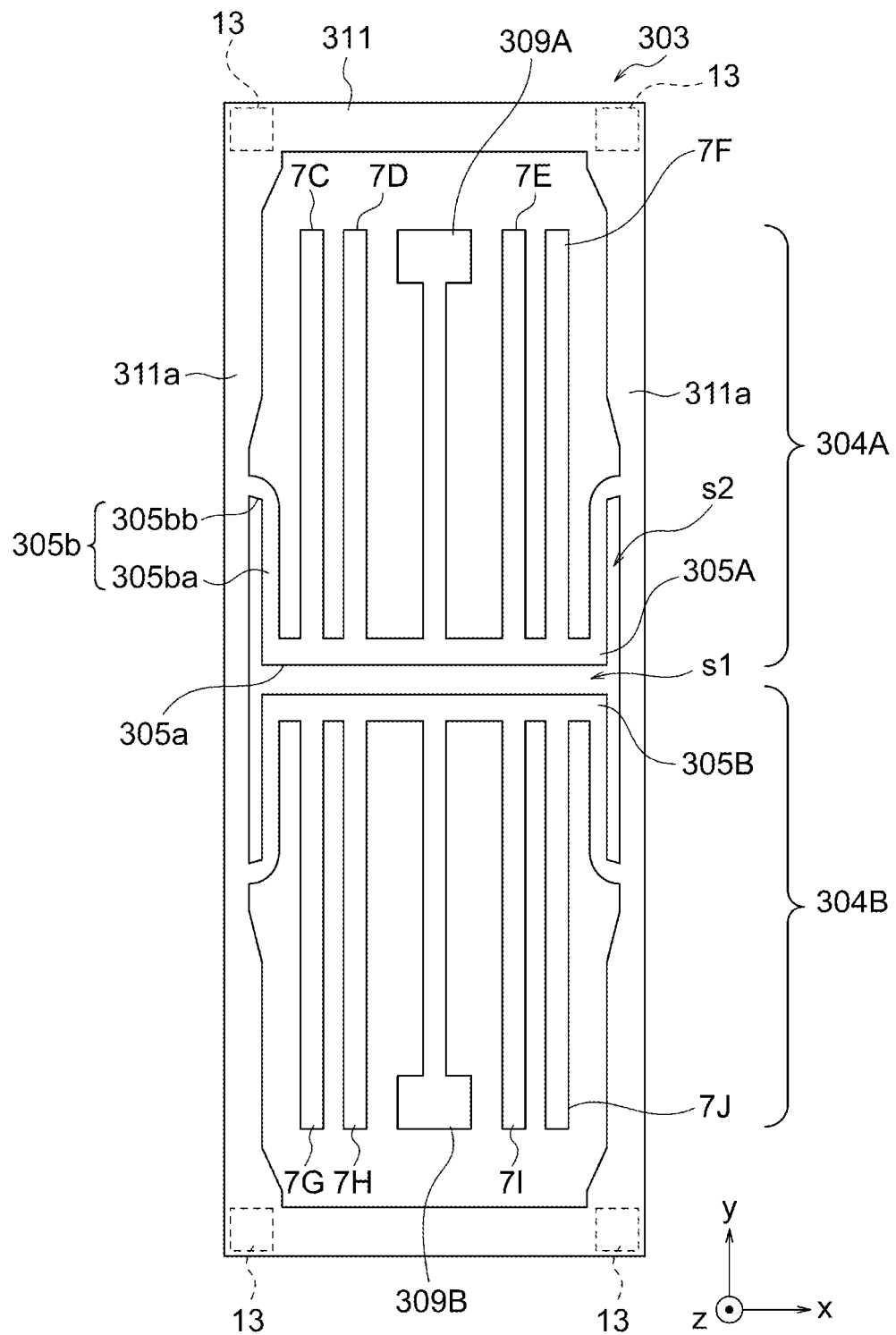
FIG. 6 is a plan view showing the configuration of a sensor element according to a third or fourth embodiment.

FIG. 6 is a plan view showing the configuration of a sensor element 301 according to the third embodiment or a sensor element 401 according to the fourth embodiment. However, in this view, illustration of conductive layers provided on the surface of the sensor element is basically omitted.

A piezoelectric body 303 in the sensor element 301 or 401 includes a shape like two piezoelectric bodies 3 in the first and second embodiments combined. That is, the piezoelectric body 303 has two units 304A and 304B. Each unit 304 has a frame 305 (305A or 305B), at least one pair (two pairs in the present embodiment) of driving arms 7 (7C to 7J) and a detecting arm 309 (309A or 309B) which extend from the frame 305 alongside each other in the y-axis direction.

The two units 304 are arranged so as to make the sides opposite from the directions of extension of the driving arms 7 and detecting arms 309 face each other. The distance between the two units 304 may be for example suitably set so that the frames 305A and 305B do not contact each other. The two units 304 for example have substantially the same shapes and sizes (shapes and sizes line symmetrical relative to a not shown symmetrical axis parallel to the x-axis).

Further, in contrast to the piezoelectric body 3 in the first embodiment which had the pair of mounting arms 11 as the portions supporting the frame 5, the piezoelectric body 303 has a frame-shaped (annular shaped) mounting frame 311 as the portion supporting the frame 305. Such a mounting frame 311 is for example harder to vibrate compared with the pair of mounting arms 11. As a result, for example, the influence of variation of bonding between the mounting frame 311 and a not shown circuit board exerted upon the detection accuracy is reduced.

The shape in a planar view of the mounting frame 311 is for example substantially a rectangular shape having four sides parallel to the x-axis or to the y-axis. In the mounting frame 311, the portions parallel to the y-axis are connected with the two ends of the frame 305 in the same way as the pair of mounting arms 11 in the first embodiment and become a pair of support parts 311a supporting the frame 305. The two units 304 are supported upon a common mounting frame 311 (common pair of support parts 311a). The four pads 13 may be arranged at suitable positions at the mounting frame 311. In the example shown, the four pads 13 are arranged at the four corners of the mounting frame 311.

The shape and dimensions of the transverse cross-section (cross-section perpendicular to the sides) of the mounting frame 311 may be constant over the whole length or may suitably change. In the example shown, the transverse cross-section is made rectangular with a constant thickness (z-axis direction) over the whole length of the mounting frame 311. However, the width differs according to the position. Specifically, the width becomes narrow in the side (long side) parallel to the y-axis relative to the side (short side) parallel to the x-axis. Further, in the long sides, the portions positioned between the connection parts 305bb in the pair of frames 305 become narrow in widths compared with their outer sides. By the short sides being made relatively broader, for example, vibration of the mounting frame 311 is suppressed. By the center sides in the long sides being made thinner, for example, vibrations transferred from the driving arms 7 to the external portion are absorbed and/or shock from the external portion is absorbed.

In contrast to the piezoelectric body 3 in the first embodiment which had one pair of driving arms 7 with respect to one frame 5, the unit 304 in the piezoelectric body 303 has two pairs of driving arms 7 with respect to one frame 305. As will be explained later (FIG. 6A and FIG. 6B), two mutually neighboring driving arms 7 (two of 7C and 7D, two of 7E and 7F, two of 7G and 7H, and two of 7I and 7J) are supplied with voltages with the same phase so as to bend together to the same sides of the x-axis direction relative to each other. Accordingly, the two mutually neighboring driving arms 7 may be interpreted as corresponding to one driving arm 7 in the first embodiment. By dividing the driving arm 7 in the first embodiment into two in this way, for example, even if the length of the driving arms 7 is made short, the mass of the driving arms 7 as a whole can be secured and in turn both reduction of size and improvement of the detection sensitivity can be achieved. More than two pairs of driving arms 7 may be provided with respect to one frame as well.

The position of the center between the mutually neighboring two driving arms 7 (or the position of each driving arm 7) may be for example made the same as the position of the driving arm 7 explained in the first embodiment. The distance between the mutually neighboring two driving arms 7 may be suitably set. The shapes and dimensions of the mutually neighboring two driving arms 7 are for example substantially the same as each other. However, they may be different as well. The piezoelectric body 303 is for example substantially line symmetrical shaped relative to a not shown symmetrical axis (detecting arm 309) and also the shapes and arrangements of the plurality of driving arms 7 are substantially line symmetrical.

In contrast to the detecting arm 9 in the first embodiment in which the shape of the transverse cross-section (xz cross-section) was substantially constant over the whole length, the detecting arms 309 in the present embodiment are so-called hammer shaped with widths becoming broader at the front ends. By the hammer shapes, for example, the mass of the detecting arms 309 is secured without making the detecting arms 309 longer, and the detection sensitivity can be improved.

The shapes and dimensions of the frames 305 may be the same as those of the frame 5 in the first embodiment. In FIG. 6, however, shapes and dimensions which are somewhat different from those in FIG. 1 are illustrated. Specifically, the extending main portions 305ba become narrower in widths than the main parts 305a. The connection parts 305bb extend so as to be oblique relative to the x-axis and somewhat flex and become broader in widths toward the mounting frame 311 side. The width of the main part 305a becomes equal to that of the portion having the narrowest width in the mounting frame 311 (center side portion in a long side). By at least parts of the extension parts 305b being made narrower than the main parts 305a, for example, the two ends of the main parts 305a become easier to rotate when viewed on a plane. As a result, for example, the displacement in the z-axis direction of the detecting arms 309 is made larger and the detection accuracy can be improved.

The sensor element 301 (third embodiment) which detects rotation around the x-axis corresponds to a combination of two sensor elements 1 (first embodiment), therefore the configurations and connection relationships of the excitation electrodes 15 and detecting electrodes 17 in each of the units 304 in the sensor element 301 may be the same as those in the sensor element 1. In the same way, the sensor element 401 (fourth embodiment) which detects rotation around the z-axis corresponds to a combination two sensor elements 201 (second embodiment), therefore the configurations and connection relationships of the excitation electrodes 15 and detecting electrodes 17 in each of the units 304 in the sensor element 401 may be the same as those in the sensor element 201.

The mutually neighboring two driving arms 7 correspond to one driving arm 7 in the first embodiment and are supplied with voltages with the same phases as each other. Therefore, between these two driving arms 7, the excitation electrodes 15A are rendered the same potentials as each other (for example the excitation electrodes 15A are connected to each other by the wiring 19), and the excitation electrodes 15B are rendered the same potentials as each other (for example the excitation electrodes 15B are connected to each other by the wiring 19).

The connection relationships of the excitation electrodes 15 and detecting electrodes 17 (or 217) between the units 304 will be explained in the following explanation of operation.

(Operation of Angular Velocity Sensor)

Figure 7A:
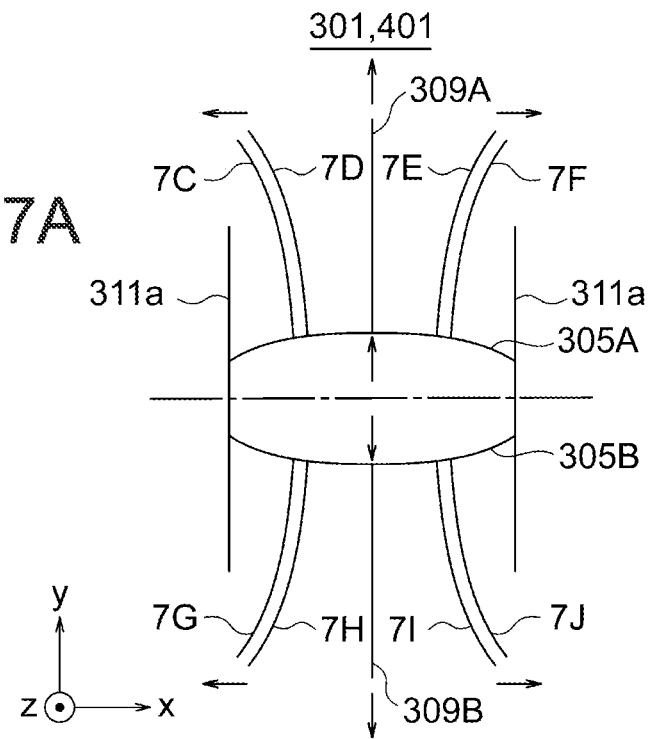
FIG. 7A and FIG. 7B are schematic views for explaining the mode of operation of the sensor element in FIG. 6.
Figure 7B:
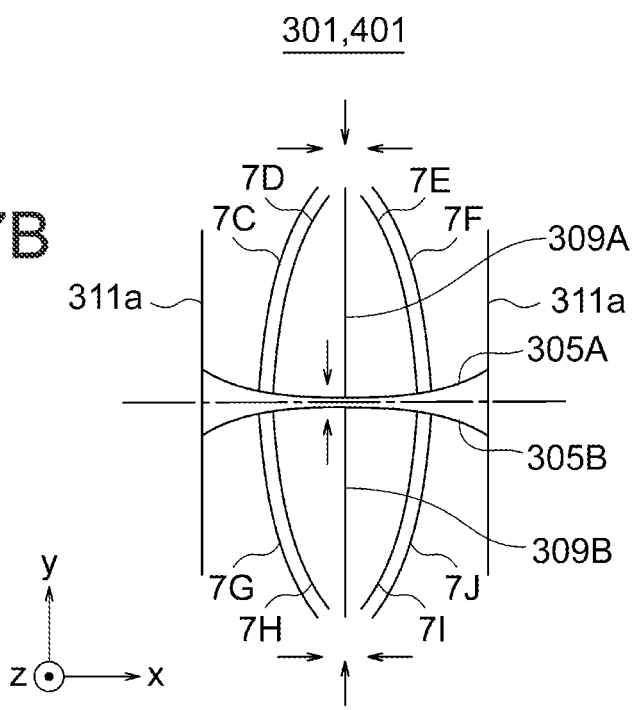

FIG. 7A and FIG. 7B are schematic plan views showing excitation states of the piezoelectric body 303 in the third or fourth embodiment and correspond to FIG. 3A and FIG. 3B of the first embodiment. In these schematic views, for the mounting frame 311, only parts of the support parts 311a are shown. Further, the frames 305 are drawn as straight shapes.

Each of the units 304 is basically excited in the same way as the excitation of the piezoelectric body 3 in the first embodiment. However, in each unit 304, the mutually neighboring two driving arms 7 are supplied with voltages with the same phase so as to bend to the mutually same side together and correspond to one driving arm 7 in the piezoelectric body 3.

Between the two units 304, for example, voltages are supplied with the same phase so that the driving arms 7 which are positioned on the same side (positive side or negative side) in the x-axis direction relative to the detecting arms 309 bend to the same side in the x-axis direction. Accordingly, the frames 305A and 305B warp in inverse directions relative to each other. Further, the detecting arms 309A and 309B are displaced to inverse directions relative to each other.

For application of voltage as described above, for example, in the driving arms 7 (7C, 7D, 7G, and 7H, or 7E, 7F, 7I, and 7J) which are positioned on the same side in the x-axis direction relative to the detecting arms 309, the excitation electrodes 15A are rendered the same potentials as each other and the excitation electrodes 15B are rendered the same potentials as each other. The excitation electrodes 15 which must be rendered the same potential are for example connected to each other by the plurality of wirings 19. Further, all of the excitation electrodes 15 are connected through two among the four pads 13 with the driving circuit 103.

FIG. 8A and FIG. 8B are schematic perspective views for explaining vibrations of the detecting arms 309 due to Coriolis forces in the sensor element 301 according to the third embodiment which detects rotation around the x-axis. FIG. 8A and FIG. 8B correspond to the states in FIG. 7A and FIG. 7B. In these views, illustration of deformations of the frames 305 and driving arms 7 is omitted.

If the sensor element 301 is rotated around the x-axis in the state where the piezoelectric body 303 is vibrating as explained with reference to FIG. 7A and FIG. 7B, in each unit 304, in the same way as the first embodiment, the detecting arm 309 vibrates in the z-axis direction due to the Coriolis force. At this time, the detecting arms 309A and 309B are vibrating with phases of displacement to inverse sides from each other in the y-axis direction, therefore receive the Coriolis forces on the same side relative to the direction of rotation around the x-axis. From another viewpoint, the detecting arms 309A and 309B vibrate so as to bend to inverse sides from each other in the z-axis direction.

In order to add the signals generated in such detecting arms 309A and 309B, for example, the detecting electrodes 17A at the detecting arm 309A and the detecting electrodes 17B at the detecting arm 309B are connected while the detecting electrodes 17B at the detecting arm 309A and the detecting electrodes 17A at the detecting arm 309B are connected. The connections are for example achieved by the plurality of wirings 19. Further, all of the detecting electrodes 17 are connected through the two among the four pads 13 with the detecting circuit 105.

FIG. 8C and FIG. 8D are schematic plan views for explaining vibrations of the detecting arms 309 due to Coriolis forces in the sensor element 401 according to the fourth embodiment which detects rotation around the z-axis. FIG. 8C and FIG. 8D correspond to the states in FIG. 7A and FIG. 7B. In these views, illustration of deformations of the frames 305 and driving arms 7 is omitted.

If the sensor element 401 is rotated around the z-axis in the state where the piezoelectric body 303 is vibrating as explained with reference to FIG. 7A and FIG. 7B, in each unit 304, in the same way as the second embodiment, the detecting arm 309 vibrates in the x-axis direction due to the Coriolis force. At this time, the detecting arms 309A and 309B are vibrating with phases of displacement to inverse sides from each other in the y-axis direction, therefore receive the Coriolis forces on the same side relative to the direction of the rotation around the z-axis. From another viewpoint, the detecting arms 309A and 309B vibrate so as to bend to inverse sides from each other in the x-axis direction.

In order to add the signals generated in such detecting arms 309A and 309B, for example, the detecting electrodes 217A at the detecting arm 309A and the detecting electrodes 217B at the detecting arm 309B are connected while the detecting electrodes 217B at the detecting arm 309A and the detecting electrodes 217A at the detecting arm 309B are connected. The connections are for example achieved by the plurality of wirings 19. Further, all of the detecting electrodes 217 are connected through the two among the four pads 13 with the detecting circuit 105.

As explained above, the angular velocity sensor or sensor element in the third or fourth embodiment includes the angular velocity sensor or sensor element in the first or second embodiment, therefore the same effects as those by the angular velocity sensor or sensor element in the first or second embodiment are exhibited. For example, detection according to the new mode of vibration becomes possible.

Further, in the third and fourth embodiments, the piezoelectric body 303 has a combination (unit 304) of the frame 305, (at least) one pair of driving arms 7, and detecting arm 309. In each unit 304, the pair of driving arms 7, detecting arm 309, and extension parts 305b extend from the main part 305a to the same sides as each other (need not be parallel). The piezoelectric body 303 has two units 304 so as to make the sides of the frames 305 opposite to the sides where the pairs of driving arms 7 extend face each other. The two frames 305 are arranged bridging a common pair of support parts 311a.

Accordingly, for example, by adding the signals detected in the two units 304, the detection sensitivity can be improved. Further, for example, in the first embodiment, a region which is between the pair of mounting arms 11 and on the negative side in the y-axis direction becomes a dead space. However, such a space is effectively utilized. As a result, both the improvement of sensitivity and reduction of size are achieved.

Further, the extension parts 305b of the two frames 305 extend from the main parts 305a toward inverse sides from each other. Therefore, for example, when forming the planar shape of the piezoelectric body 303 by wet etching from one side or the two sides in the z-axis direction, the etching time can be shortened. For example, when the two frames extend over the pair of support parts 311a along the x-axis (such a case is also new as already explained), sometimes a long etching time is required until a slit which penetrates through the piezoelectric body 303 in the z-axis direction is formed between the two frames. However, by the extension parts 305b extending from the two frames 305 to inverse sides from each other, a slit s1 between the two main parts 305a (FIG. 6) is connected to slits s2 (FIG. 6) which extend in the y-axis direction at the two ends. As a result, between the two main parts 305a, etching is carried out not only in the z-axis direction, but also from the slit s2 sides. As a result, the time for formation of the slit s1 is shortened. From another viewpoint, the width of the slit s1 can be made narrower for the same etching time, therefore the piezoelectric body 303 can be reduced in size.

The effect of shortening the etching time as described above becomes conspicuous in a case where the piezoelectric body 303 is comprised of a single crystal, this single crystal has anisotropy with respect to wet etching, and, concerning the etching from the z-axis direction, an etching stop which occurs by crystal faces facing in the width direction of the slit s1 (y-axis direction) more easily occurs than the etching stop which occurs by crystal faces facing in the width direction of the slit s2 (x-axis direction). As one example, in a quartz crystal, the effect described above becomes conspicuous in a case where the electrical axis, mechanical axis, and optical axis are substantially parallel to the x-axis, y-axis, and z-axis.

When the piezoelectric body 303 comprised of a single crystal is formed by wet etching, the side surfaces (surfaces intersecting the xy plane) of the frames 305 are comprised of crystal faces (not always crystal faces causing etching stop). Accordingly, when the piezoelectric body 303 is comprised of a single crystal and the surfaces intersecting the xy plane of the two frames 305 are comprised of crystal faces, it is understand that the effect described above was obtained.

Fifth Embodiment (Sensor Element)

Figure 9:
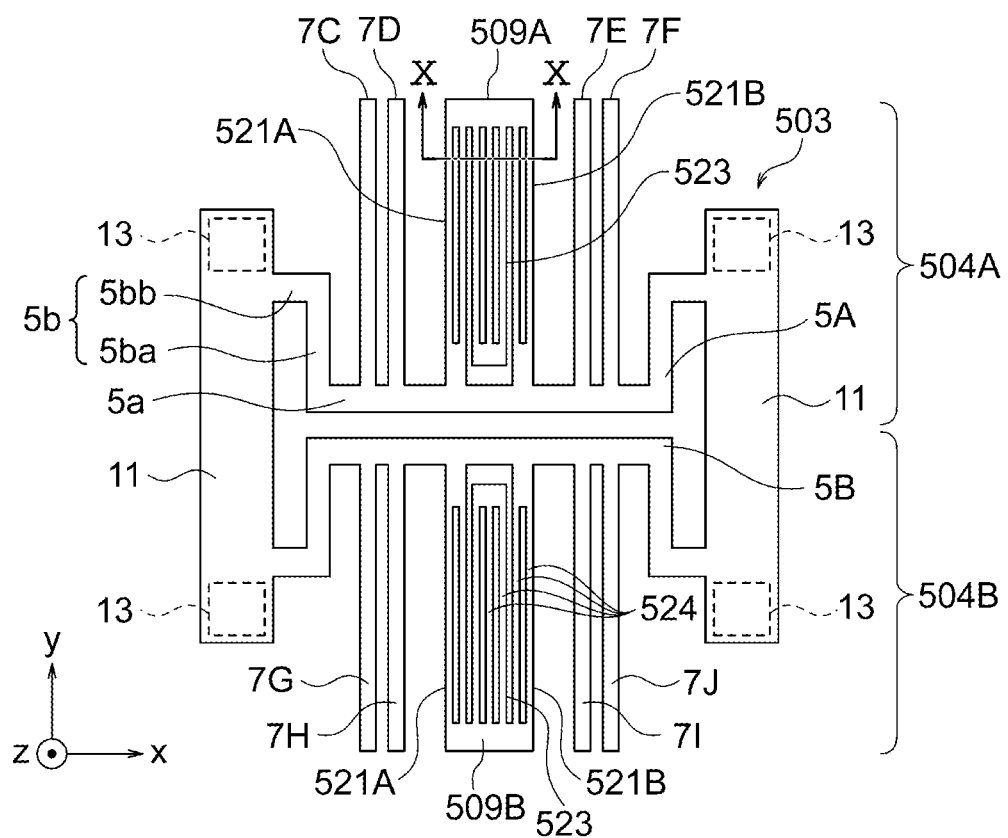
FIG. 9 is a plan view showing the configuration of a sensor element according to a fifth embodiment.

FIG. 9 is a plan view showing the configuration of a sensor element 501 according to a fifth embodiment. In this view, however, illustration of a conductive layer provided on the surface of the sensor element 501 is basically omitted.

The sensor element 501 is configured as a sensor element which detects the angular velocity around the x-axis in the same way as the sensor element 1 in the first embodiment. The sensor element 501 (piezoelectric body 503) mainly differs from the other embodiments in the shapes of the detecting arms.

The parts other than the shapes of the detecting arms 509 (509A and 509B) may be the same as those in the other embodiments. In the example shown, the sensor element 501 is configured so as to have two units 504A and 504B in the same way as the third embodiment. However, the portions supporting the units 504 are made the pair of mounting arms 11 in the same way as the first embodiment. Further, the specific shapes and dimensions of the frames 5A and 5B in the units 504 are made closer to those in the first embodiment than those in the third embodiment. The arrangement of the plurality of excitation electrodes 15 and the connection relationships of the same may be the same as those in the third embodiment.

The positions and shapes as the entireties of the detecting arms 509 may be the same as those in the other embodiments. That is, the detecting arms 509 are at least positioned between the pair of driving arms 7 and extend from the frames 5 in the y-axis direction.

However, the detecting arm 509 has first arms 521 (521A and 521B) which extend from the frame 5 and a second arm 523 which extends from the front end sides and lateral sides of the first arms 521 toward the frame 5 side. The front end of the second arm 523 is not connected to the frame 5 and becomes free end. The pair of first arms 521 are line symmetrical shaped relative to a not shown center line of the piezoelectric body 503, and the second arm 523 is positioned between them. The various dimensions of the first arms 521 and second arm 523 and the size relationships between the two may be suitably set.

Although not particularly shown, one first arm 521 may extend from the frame 5 on the center line of the piezoelectric body 503, and one pair of second arms 523 may extend from the front end of the first arm 521 toward the frame 5 on the two sides thereof in the x-axis direction.

Further, the detecting arm 509 has one or more via grooves (notation is omitted) which penetrate in the z-axis direction and extend along the detecting arm 509. From another viewpoint, the detecting arm 509 has pluralities of divided arms 524 which extend alongside each other and are connected to each other at their roots and front ends. In a mode such as in the present embodiment where the detecting arm 509 has the first arms 521 and second arm 523, via grooves may be provided in either of the first arms 521 or second arm 523. In the example shown, they are provided in both.

The number and dimensions of the divided arms 524 may be suitably set. In the example shown, each first arm 521 is configured by two divided arms 524, and the second arm 523 is configured by three divided arms 524.

(Detecting Arms)

Figure 10:
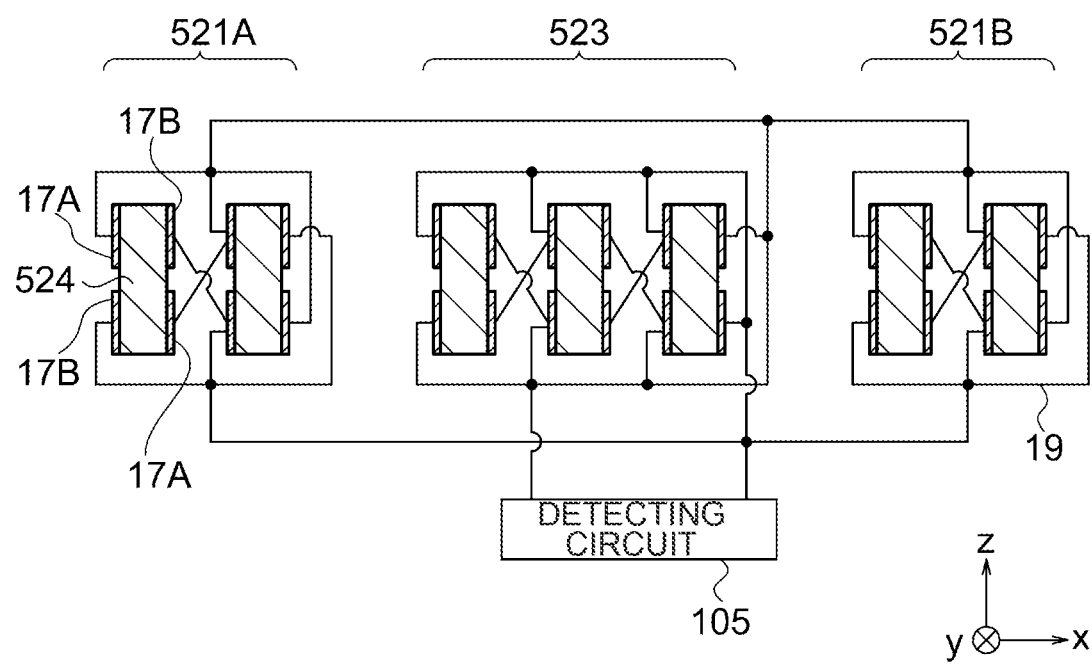
FIG. 10 is a cross-sectional view taken along the X-X line in FIG. 9.

FIG. 10 is a cross-sectional view taken along the X-X line in FIG. 9.

In the detecting arm 509, for example, the first arms 521 and second arm 523 are respectively provided with detecting electrodes 17. Further, in these arms (521, 523), the pluralities of divided arms 524 are respectively provided with detecting electrodes 17.

The arrangement of the detecting electrodes 17 in each divided arm 524 is the same as that in the first embodiment. That is, as indicated by notations attached to the divided arm 524 on the leftmost side on the drawing sheet, in each divided arm 524, the detecting electrodes 17A are provided in a region of +z in the side surface of −x and in a region of −z in the side surface of +x. In each divided arm 524, the detecting electrodes 17B are provided in a region of −z in the side surface of −x and in a region of +z in the side surface of +x.

In each divided arm 524, the detecting electrodes 17A are connected to each other and the detecting electrodes 17B are connected to each other. Accordingly, in the same way as the detecting arm 9 in the first embodiment, when the divided arm 524 warps in the z-axis direction, a signals in accordance with an amount of flexing of the divided arm 524 is extracted by the detecting electrodes 17A and 17B.

In each of the first arms 521 and second arm 523, between the two or more divided arms 524, the detecting electrodes 17A are connected to each other and the detecting electrodes 17B are connected to each other. Accordingly, when each of the arms (521 or 523) warps in the z-direction, detection signals of the plurality of divided arms 524 are added in each of the arms.

In each detecting arm 509, the detecting electrodes 17A and the detecting electrodes 17B are connected between the first arms 521 and the second arm 523. Accordingly, when the first arms 521 and the second arm 523 flexurally deform so as to bend to inverse sides from each other in the z-axis direction, their detection signals are added to each other.

Between the two first arms 521, the detecting electrodes 17A are connected to each other and the detecting electrodes 17B are connected to each other. Unlike the present embodiment, in a case where two second arms 523 are provided on the two sides of one first arm 521, the detecting electrodes 17A are connected to each other and the detecting electrodes 17B are connected to each other between the two second arms 523.

Between the detecting arm 509A and the detecting arm 509B, in the same way as the third embodiment, the detecting electrodes 17A and the detecting electrodes 17B are connected to each other. Accordingly, at the time when the detecting arms 509A and 509B receive the Coriolis forces on inverse sides from each other in the z-axis direction and flexurally deform, the signals generated in the two are added.

The pluralities of detecting electrodes 17 are for example connected by the wirings 19. All of the detecting electrodes 17 divided into two sets are connected to two among the four pads 13 by the wirings 19 and in turn connected to the detecting circuit 105.

(Operation of Angular Velocity Sensor)

The plurality of driving arms 7 are excited in the same way as in the third embodiment (FIG. 7A and FIG. 7B). Accordingly, the frames 5A and 5B warp to inverse sides from each other. Further, the detecting arms 509A and 509B are displaced to inverse sides from each other.

Figure 11A:
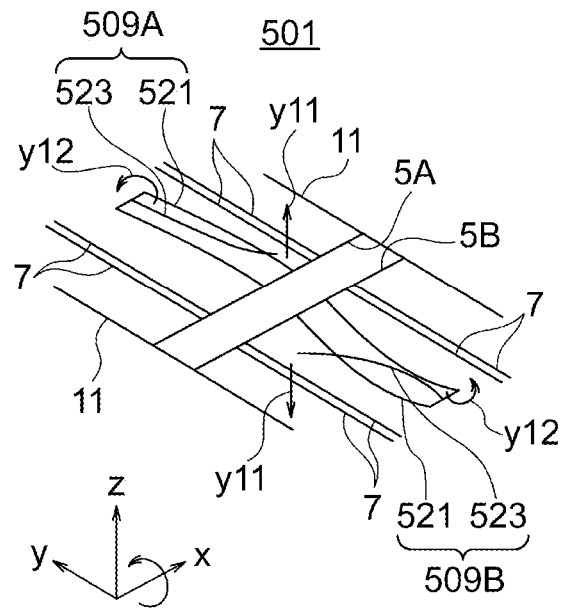
FIG. 11A and FIG. 11B are schematic views for explaining the mode of operation of the sensor element in FIG. 9.
Figure 11B:
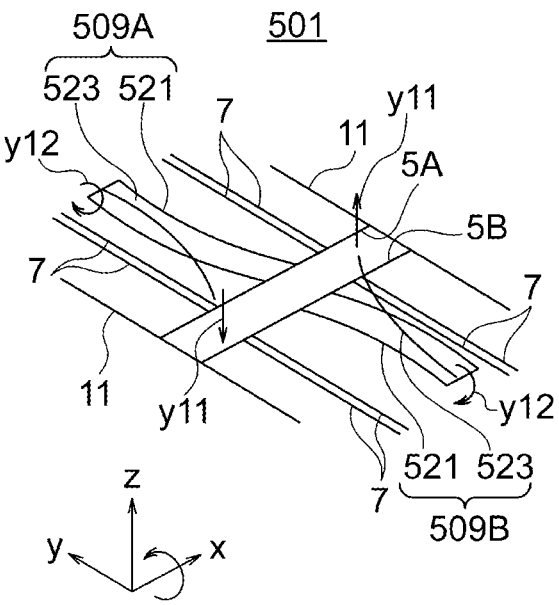

FIG. 11A and FIG. 11B are schematic perspective views for explaining vibrations of the detecting arms 509 due to the Coriolis forces in the sensor element 501 and correspond to the states in FIG. 8A and FIG. 8B. In these views, illustration of deformations of the frames 5 and driving arms 7 is omitted.

If the sensor element 501 is rotated around the x-axis in the state where vibrations explained with reference to FIG. 7A and FIG. 7B occur, in the same way as the third embodiment, the detecting arms 509A and 509B receive the Coriolis forces at inverse sides from each other in the z-axis direction. Further, the signals generated in the two detecting arms 509 are added.

In each of the detecting arms 509, the second arm 523 flexurally deforms so as to bend to the directions of the Coriolis forces indicated by arrows y11. Further, bending moments making the second arm 523 generates such flexural deformations are transferred to the first arms 521 as indicated by arrows y12 and act upon the first arms 521 so as to flexurally deform the first arms 521 to bend to the opposite sides to the directions of the Coriolis forces. Accordingly, the first arms 521 and the second arm 523 flexurally deform to inverse sides from each other in the z-axis direction.

The signal (voltage) generated by the flexural deformation in the z-axis direction in each of the first arms 521 and second arm 523 is extracted by the detecting electrodes 17. Further, the signals generated in the first arms 521 and second arm 523 are added.

In the above fifth embodiment as well, the frames 5 are arranged bridging the pair of mounting arms 11 which are separated from each other in the x-axis direction, the driving arms 7 extend from the main parts 5a in the frames 5 alongside each other in the y-axis direction at the positions separated from each other in the x-axis direction, the detecting arms 509 extend from the main parts 5a in the y-axis direction at the positions between the single pairs of driving arms 7 in the x-axis direction, the driving circuit 103 supplies voltages with inverse phases from each other to the single pairs of driving arms 7 so that the single pairs of driving arms 7 vibrate so as to bend to inverse sides from each other in the x-axis direction (the plurality of excitation electrodes 15 are arranged so that such voltage application is possible), and the detecting circuit 105 detects the signals generated by bending deformations in the z-axis direction of the detecting arms 509 (the plurality of detecting electrodes 17 are arranged so as to enable such detection).

Accordingly, the same effects as those by the first embodiment are exhibited. For example, detection according to the new mode of vibration becomes possible. Further, for example, the Coriolis forces directly act upon the detecting arms, so the improvement of detection sensitivity can be expected.

Further, in the present embodiment, the detecting arms 509 are configured by pluralities of divided arms 524 and the detecting arms 509 are configured by the first arms 521 and second arms 523. Due to this, for example, both reduction of size of the sensor element 501 and improvement of detection sensitivity can be achieved.

In the first to fifth embodiments explained above, the mounting arms 11 and support parts 311a are examples of the support parts.

The present invention is not limited to the above embodiments and may be executed in various ways.

The plurality of embodiments explained above may be suitably combined. For example, the pair of mounting arms 11 and the mounting frame 311 can be substituted with each other. The hammer shapes of the detecting arms 309 in the third and fourth embodiments may be applied to the first and second embodiments as well. The divided arms 524 in the fifth embodiment may be applied to any other embodiment. The first arms 521 and second arms 523 in the fifth embodiment may be applied to the first and third embodiments.

The piezoelectric body may be configured having (at least) a pair of driving arms extending toward one side of the y-axis direction and only one detecting arm extending toward the other side of the y-axis direction (shape like a two-prong fork) as well. That is, the pair of driving arms and the detecting arm need not to extend toward the same direction (alongside each other). In this case, for example, there is no possibility of the driving arms and the detecting arm abutting against each other in the x-axis direction.

The number of the driving arms and the number of the detecting arms both of which extend from one frame may be suitably combined. For example, with respect to a pair of driving arms, a detecting arm which extends to the positive side in the y-axis direction and a detecting arm which extends to the negative side in the y-axis direction may be provided as well. Further, two or more detecting arms which extend alongside each other may be provided between a pair of driving arms as well.

Further, for example, two pairs of driving arms which extend from one frame to inverse sides from each other may be provided as well. In this case, a pair of driving arms which extend to the +y side and a pair of driving arms which extend to the −y side are excited so as to vibrate to inverse sides from each other in the x-axis direction (for example, so that the pair of driving arms on the −y side become closer to each other when the pair of driving arms on the +y side are separated from each other). Due to this, the moments from the two pairs of driving arms are added to one frame.

In the third and fourth embodiments, the two units 304 were supported upon the common support part so as to make the sides opposite to the sides of extension of the driving arms and detecting arms face each other. However, the two units 304 may be supported upon the common support part so as to make the sides of extension of the driving arms and detecting arms face each other.

The sensor element or angular velocity sensor may be configured as a portion of a MEMS (micro electromechanical system). In this case, a piezoelectric body configuring the sensor element may be mounted on the substrate of the MEMS. Otherwise, the substrate of the MEMS may be configured by a piezoelectric material and the piezoelectric body of the sensor element may be configured by a portion of the substrate.

The shapes of the extension parts of the frames are not limited to L-shapes or ones similar to L-shape. So far as the extension parts include portions intersecting (perpendicular in the embodiment) the x-axis, compared with a case where the entire frame is parallel to the x-axis, the frames are made longer. For example, the extension parts may include U-shapes or Q-shapes or may be shaped so as to meander like an S-shape. As understood from the above exemplifications, the positions in the y-axis direction of the two ends of one extension part (the position of connection with the main part and the position of connection with the support part) may be the same as each other. However, if the shapes of the extension parts are L-shapes or ones similar to L-shape (shapes comprised by portions (extending main portions 5ba etc.) which extend from the main parts along the y-axis and portions (connection parts 5bb etc.) which extend from the former portions in the direction intersecting the y-axis and are connected to the support parts), estimation of behaviors of the frames which occur by the excitation of the vibrating arms is easy, and in turn the design is easy.

REFERENCE SIGNS LIST

1 . . . sensor element, 3 . . . piezoelectric body, 5 . . . frame, 5a . . . main part, 5b . . . extension part, 7 . . . driving arm, 9 . . . detecting arm, 11 . . . mounting arm (support part), 51 . . . angular velocity sensor, 103 . . . driving circuit, and 105 . . . detecting circuit.

The invention claimed is:

1. An angular velocity sensor comprising:
a piezoelectric body,
a driving circuit which supplies a voltage to the piezoelectric body, and
a detecting circuit which detects a signal generated in the piezoelectric body, wherein
the piezoelectric body comprises
a pair of support parts which are separated from each other in an x-axis direction in an orthogonal coordinate system xyz,
a frame comprising
a main part which extends along the x-axis and
a pair of extension parts which, when viewed in a z-axis direction, connect two ends of the main part and inner sides of the pair of support parts, at least parts of which extend in directions intersecting the x-axis,
a pair of driving arms which extend from the main part alongside each other in a y-axis direction at positions separated from each other in the x-axis direction, and
a detecting arm which extends from the main part in the y-axis direction at a position which is between the pair of driving arms in the x-axis direction,
the driving circuit supplies voltages with inverse phases to each other to the pair of driving arms, the voltages making the pair of driving arms vibrate so as to bend to inverse sides from each other in the x-axis direction, and
the detecting circuit detects the signal generated by bending deformation in the z-axis direction or x-axis direction of the detecting arm.

2. The angular velocity sensor according to claim 1, wherein the detecting circuit detects a signal generated by bending deformation of the detecting arm in the x-axis direction.

3. The angular velocity sensor according to claim 1, wherein the detecting circuit detects a signal generated by bending deformation of the detecting arm in the z-axis direction.

4. The angular velocity sensor according to claim 1, wherein:
the pair of driving arms, the detecting arm, and the pair of extension parts extend from the main part to the same sides as each other,
the piezoelectric body comprises two sets each comprising the frame, the pair of driving arms, and the detecting arm, the two sets facing each other at sides of the frames opposite to sides of extensions of the pairs of driving arms, and
the two frames are arranged bridging the common pair of support parts.

5. The angular velocity sensor according to claim 4, wherein the piezoelectric body is comprised of a single crystal, and surfaces of the two frames intersecting an xy plane are comprised of crystal faces.

6. The angular velocity sensor according to claim 1, wherein the detecting arm is located at a center between the pair of driving arms.

7. The angular velocity sensor according to claim 6, wherein the piezoelectric body comprises, as arms which extend from the frame and vibrate by being supplied with a voltage,
only the pair of driving arms or
only the pair of driving arms and arms which extends alongside the pair of driving arms.

8. A sensor element comprising
a piezoelectric body and
a plurality of excitation electrodes, a plurality of detecting electrodes, and a plurality of wirings which are all arranged at the piezoelectric body, wherein
the piezoelectric body comprises
a pair of support parts which are separated from each other in an x-axis direction in an orthogonal coordinate system xyz,
a frame comprising
a main part which extends along the x-axis and
a pair of extension parts which, when viewed in a z-axis direction, connect two ends of the main part and inner sides of the pair of support parts, at least parts of which extend in directions intersecting the x-axis,
a pair of driving arms which extend from the main part alongside each other in a y-axis direction at positions separated from each other in the x-axis direction, and
a detecting arm which extends from the main part in the y-axis direction at a position which is between the pair of driving arms in the x-axis direction,
the plurality of excitation electrodes are in an arrangement enabling application of voltages exciting the pair of driving arms in the x-axis direction,
the plurality of detecting electrodes are in an arrangement enabling detection of a signal generated by vibration of the detecting arm in the x-axis direction or z-axis direction, and
the plurality of wirings connect the plurality of excitation electrodes in connection relationships where voltages with inverse phases from each other are supplied from the plurality of excitation electrodes to the pair of driving arms, the voltages making the pair of driving arms vibrate so as to bend to inverse sides from each other in the x-axis direction.

* * * * *